United States Patent
Han et al.

(10) Patent No.: US 10,068,832 B2
(45) Date of Patent: Sep. 4, 2018

(54) EMI SHIELDING STRUCTURE HAVING HEAT DISSIPATION UNIT AND METHOD FOR MANUFACTURING THE SAME

(71) Applicant: Samsung Electronics Co., Ltd., Suwon-si, Gyeonggi-do (KR)

(72) Inventors: Eun-bong Han, Suwon-si (KR); Hyeon-hyang Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/840,326

(22) Filed: Dec. 13, 2017

(65) Prior Publication Data

US 2018/0204783 A1 Jul. 19, 2018

(30) Foreign Application Priority Data

Jan. 13, 2017 (KR) ........................ 10-2017-0006383

(51) Int. Cl.
| | |
|---|---|
| H05K 1/00 | (2006.01) |
| H01L 23/552 | (2006.01) |
| H01L 23/495 | (2006.01) |
| H01L 23/22 | (2006.01) |
| H01L 23/427 | (2006.01) |
| H05K 9/00 | (2006.01) |
| H05K 7/20 | (2006.01) |
| G06F 1/20 | (2006.01) |
| H05K 1/02 | (2006.01) |
| H01L 23/367 | (2006.01) |
| F28D 15/02 | (2006.01) |

(52) U.S. Cl.
CPC ........ *H01L 23/427* (2013.01); *F28D 15/0233* (2013.01); *G06F 1/203* (2013.01); *H01L 23/3675* (2013.01); *H01L 23/552* (2013.01); *H05K 1/0216* (2013.01); *H05K 7/2099* (2013.01); *H05K 7/20336* (2013.01); *H05K 9/0088* (2013.01)

(58) Field of Classification Search
CPC ... H01L 23/427; H01L 23/552; H05K 9/0088; H05K 7/2099; H05K 1/0216; H05K 7/20336
USPC .......................... 174/252; 257/659, 667, 687
See application file for complete search history.

(56) References Cited

U.S. PATENT DOCUMENTS 5,311,060 A * 5/1994 Rostoker ................ H05K 3/303
257/667
5,866,953 A * 2/1999 Akram .................. H01L 21/563
257/687

(Continued)

FOREIGN PATENT DOCUMENTS

| JP | 2013-178760 A | 9/2013 |
|---|---|---|
| JP | 2014049536 A | 3/2014 |

(Continued)

*Primary Examiner* — Sherman Ng
(74) *Attorney, Agent, or Firm* — Jefferson IP Law, LLP

(57) ABSTRACT

An electromagnetic interference shielding structure is disclosed. The electromagnetic interference shielding structure includes an insulating member covering at least one circuit element mounted on a printed circuit board (PCB), a shielding member covering the insulating member, and a heat dissipator having a surface adhering to the shielding member to transfer heat emitted from the at least one circuit element to a place where temperature is relatively low.

16 Claims, 38 Drawing Sheets

(56) References Cited

U.S. PATENT DOCUMENTS

| | | | |
|---|---|---|---|
| 6,601,293 B1* | 8/2003 | Glenn | H01L 23/24 |
| | | | 29/841 |
| 7,188,484 B2 | 3/2007 | Kim | |
| 8,824,142 B2 | 9/2014 | Jewell-Larsen et al. | |
| 9,244,504 B2 | 1/2016 | Hsieh et al. | |
| 9,307,682 B2 | 4/2016 | Fujieda et al. | |
| 2009/0166819 A1* | 7/2009 | Chen | B82Y 30/00 |
| | | | 257/659 |
| 2012/0280374 A1* | 11/2012 | Choi | H01L 21/50 |
| | | | 257/659 |
| 2015/0282387 A1 | 10/2015 | Yoo et al. | |
| 2015/0323966 A1 | 11/2015 | Merz et al. | |
| 2015/0342089 A1 | 11/2015 | Kim et al. | |
| 2016/0007504 A1 | 1/2016 | Wu | |
| 2016/0043066 A1 | 2/2016 | Funabashi et al. | |
| 2016/0109912 A1 | 4/2016 | Shen | |
| 2016/0262292 A1 | 9/2016 | Kuk et al. | |
| 2016/0282914 A1 | 9/2016 | Saito et al. | |
| 2016/0295679 A1 | 10/2016 | Yeini et al. | |

FOREIGN PATENT DOCUMENTS

| | | |
|---|---|---|
| JP | 5665948 B1 | 2/2015 |
| JP | 2015-088888 A | 5/2015 |
| KR | 10-2016-0142720 A | 12/2016 |

* cited by examiner

FIG. 24C

EMI SHIELDING STRUCTURE HAVING HEAT DISSIPATION UNIT AND METHOD FOR MANUFACTURING THE SAME

CROSS-REFERENCE TO RELATED APPLICATION(S)

This application claims the benefit under 35 U.S.C. § 119(a) of a Korean patent application filed on Jan. 13, 2017 in the Korean Intellectual Property Office and assigned Serial number 10-2017-0006383, the entire disclosure of which is hereby incorporated by reference.

TECHNICAL FIELD

The present disclosure relates to an electro-magnetic interference (EMI) shielding structure having a heat dissipation unit and a method for manufacturing the same. More particularly, the present disclosure relates to an EMI shielding structure having a heat dissipation unit capable of dissipating heat generated from a circuit element shielded by the EMI shielding structure to a relatively low-temperature place to prevent hot spots from occurring in an electronic device and a method for manufacturing the same.

BACKGROUND

Generally, an electronic device such as a mobile phone (e.g., a smart phone) includes a mobile application processor chip (hereinafter, referred to as 'AP chip') responsible for data operation processing, a memory chip storing data, and various passive devices. In particular, the AP chip and the memory chip should be continuously driven when they play videos for a long time or run game applications, so the heat generation temperature rises. As a result, a hot spot where high-temperature heat is generated occurs at a part where the chips are disposed. A user feels uncomfortable or has experienced difficulties in grasping the mobile phone due to the hot spot when he/she holds the mobile phone.

The mobile phone has a temperature control circuit to prevent deterioration in the AP chip and various circuit elements placed around the AP chip due to the rising heat generation temperature of the AP chip. The temperature control circuit reduces a clock ratio of AP chip to lower the heat generation temperature of the AP chip. However, if the clock ratio of the AP chip is reduced, an operation processing speed of data becomes slower, which causes a lag when playing videos or running a game.

On the other hand, a plurality of circuit elements including the AP chip, the memory chip, and the like are covered with a metal shield can for the electromagnetic interference shielding. The inside of the metal shield can is provided with an air gap so that the metal shield can is insulated from the circuit elements. Since the air gap has low thermal conductivity, the heat radiated from the AP chip and the memory chip is not transferred to the metal shield can, thereby increasing the deterioration in the AP chip and the memory chip.

To solve this heat generation problem, a heat pipe was disposed between the metal shield can and a metal frame to transfer the heat generated from the AP chip and the memory chip from the metal shield can to the metal frame. In this case, thermal interface materials (TIMs) are each disposed between the heat pipe and the metal shield can and between the heat pipe and the metal frame of the electronic device to maximize heat transfer efficiency. The TIM was designed to eliminate the air gap between two adjacent members and increase a contact area to achieve the efficient heat transfer.

However, when the TIM is used, there is a problem that the thickness of the mobile phone is increased due to a thickness of the TIM and the number of manufacturing processes of products is increased because a plurality of TIMs are disposed in many places.

In addition, the use of a metal shield can for shielding electromagnetic interference has raised manufacturing costs.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an electromagnetic interference shielding structure in which a part or the whole of a heat dissipation unit is embedded and a method for manufacturing the same.

Another aspect of the present disclosure is to provide an electromagnetic interference shielding structure capable of minimizing a thickness of an electronic device to which a heat dissipation unit (e.g., heat dissipator) and an electromagnetic interference shielding structure are applied, and a method for manufacturing the same.

In accordance with an aspect of the present disclosure, an electromagnetic interference shielding structure is provided. The electromagnetic interference shielding structure includes an insulating member covering at least one circuit element mounted on a printed circuit board (PCB), a shielding member covering the insulating member, and a heat dissipator having a surface adhered to the shielding member and configured to transfer heat emitted from the at least one circuit element to a place where temperature is relatively low.

At least a part of the heat dissipator may be embedded in the shielding member.

An upper surface of the shielding member may be formed with an insertion groove into which a part of the heat dissipator is inserted.

The heat dissipator may be inserted into a groove formed on a heat dissipation target disposed opposite to the upper surface of the shielding member.

An inner space of the heat dissipator may be stored with a liquefied volatile material, and the inner space may be formed with a passage through which a gaseous volatile material moves.

The passage may be configured of any one of a porous member, a plurality of channels formed by a fine pattern, and a net member.

The shielding member may include a shielding dam surrounding a side surface of the insulating member, an edge bridge formed on an upper part of the shielding dam, and a shielding layer covering the upper surface of the insulating member and contacting the edge bridge, and the heat dissipator may be embedded in the shielding layer.

The heat dissipator may be provided in plural.

The heat dissipator may be formed on a heat dissipation target corresponding to the upper surface of the shielding member.

The heat dissipator may include a first fine pattern formed on a recess of one surface of the heat dissipation target, a metal sheet bonded to the heat dissipation target, a second fine pattern formed on one surface of the metal sheet to face the first fine pattern, and a liquefied volatile material stored in an inner space of the heat dissipator.

The first and second fine patterns may be formed by three-dimensional (3D) printing.

A part of the first fine pattern or a part of the second fine pattern may be formed to have a height larger than that of the first and second fine patterns.

The heat dissipation target may be formed with a plurality of holes for injecting a volatile material into an inner space of the heat dissipation target, and the plurality of holes may be closed by a sealing member.

In accordance with another aspect of the present disclosure, an electromagnetic interference shielding structure is provided. The electromagnetic interference shielding structure includes an insulating member covering at least one circuit element mounted on a printed circuit board (PCB), a shielding member covering the insulating member, and a heat dissipator integrally formed on an upper part of the shielding member to transfer heat emitted from the at least one circuit element to a place where temperature is relatively low.

An inner space of the heat dissipator may be stored with a liquefied volatile material, and formed with a plurality of channels through which the volatile material moves along an inner side surface thereof.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, and disposing a heat dissipator on an upper surface of the insulating member.

The method may further include after the disposing of the heat dissipator, forming an edge bridge along an upper end of the shielding dam, and forming a shielding layer covering the insulating member and the heat dissipator in the space formed by the edge bridge.

The method may further include after the disposing of the heat dissipator, forming a shielding layer covering an upper end of the shielding dam and the heat dissipator.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, forming a shielding layer covering an upper end of the shielding dam and the heat dissipator, and disposing the heat dissipator on an upper surface of the shielding layer.

In the forming of the shielding layer, a recess into which a part of the heat dissipator is inserted may be formed.

The method may further include contacting the heat dissipator with the heat dissipation target disposed opposite to the upper surface of the shielding layer.

A part of the heat dissipator may be inserted into the groove formed on the heat dissipation target.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, forming a shielding layer covering an upper end of the shielding dam and the insulating member, and disposing a heat dissipator on an upper surface of the shielding layer.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, forming a shielding layer covering an upper end of the shielding dam and the insulating member, and forming a heat dissipator on a heat dissipation target opposite to an upper surface of the shielding layer. The method may further include contacting the shielding layer with the heat dissipator.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, forming a shielding layer covering an upper end of the shielding dam and the insulating member, and forming a heat dissipator to cover an upper surface of the shielding layer.

In accordance with another aspect of the present disclosure, a method for manufacturing an electromagnetic interference shielding structure is provided. The method includes forming a shielding dam to surround at least one circuit element mounted on a printed circuit board (PCB), forming an insulating member covering the at least one circuit element in a space formed by the shielding dam, and forming a heat dissipator to cover an upper end of the shielding dam and an upper surface of the insulating member.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with accompanying drawings, in which:

FIGS. 23A, 23B, 23C, 23D, 23E, 23F, 24A, 24B, 24C, 24D, 24E, and 24F are diagrams sequentially illustrating the manufacturing process of the heat dissipation unit illustrated in FIG. 22 according to an embodiment of the present disclosure;

Throughout the drawings, like reference numerals will be understood to refer to like parts, components, and structures.

DETAILED DESCRIPTION

Figure 1A:
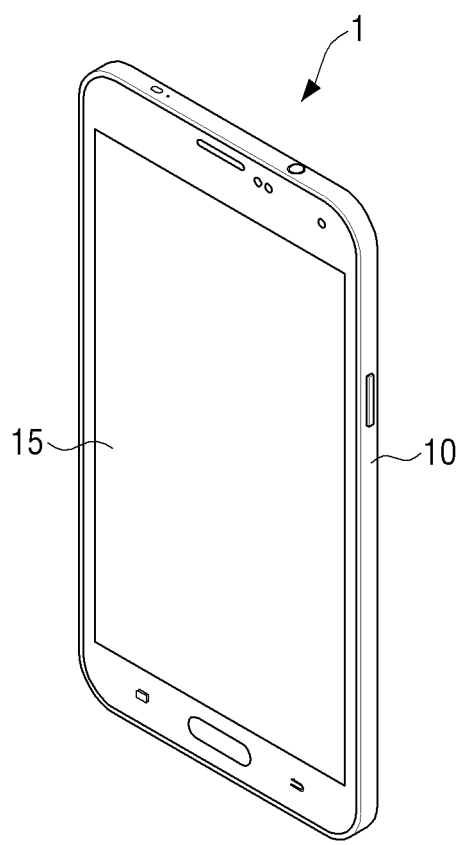
FIG. 1A is a perspective view illustrating a mobile phone having an electromagnetic interference shielding structure having a heat dissipation unit according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It is to be understood that when an element is described as being "on" or "in contact" with another element, the element may be in direct contact with or may be connected to other elements but may be connected to other elements via another component. On the other hand, it can be understood that when an element is described as being "directly on" or "directly adjacent to" another element, there is no other element in between. Other expressions describing the relationship between components, for example, "~between" and "directly~between", or the like may be interpreted similarly.

Terms such as 'first', 'second', and the like, may be used to describe various components, but the components are not to be interpreted to be limited to the terms. These terms may be used to differentiate one component from other components. For example, a 'first' component may be named a 'second' component and the 'second' component may also be similarly named the 'first' component, without departing from the scope of the present disclosure.

Singular forms are intended to include plural forms unless the context clearly indicates otherwise. It may be interpreted that terms "include", "have", or the like, specify the presence of features, numerals, operations, components, parts mentioned in the present specification, or a combination thereof, but do not preclude the addition of one or more other features, numerals, operations, components, parts, or a combination thereof.

Terms used in various embodiments of the present disclosure may be interpreted as the same meanings as meanings that are generally known to those skilled in the art unless defined otherwise.

An electromagnetic interference shielding structure according to the present disclosure may be applied to an electronic device, which will be described below as an example applied to a mobile phone. However, the electromagnetic interference shielding structure according to the present disclosure may be applied not only to a mobile phone but also to a display device, a wearable device, or the like.

The electromagnetic interference shielding structure according to embodiments of the present disclosure may be formed by three-dimensional (3D) printing. When the electromagnetic interference shielding structure is shaped, a part or the whole of a heat dissipation unit (e.g., heat pipe) is embedded in a shielding layer to be able to transfer high-temperature heat generated from a heat source (application processor chip (AP chip), memory chip, or the like shielded by the electromagnetic interference shielding structure) to the heat dissipation unit. In this case, as a part or the whole of the heat dissipation unit is embedded in the electromagnetic shielding structure in a state in which it is completely in close contact with an insulating member and the shielding layer that are formed by 3D printing, a contact area between the insulating member and the shielding layer may be maximized.

Accordingly, when the electromagnetic interference shielding structure according to the embodiments of the present disclosure is applied to a mobile phone, high-temperature heat generated from a heat source may be effectively transferred to the heat dissipation unit without using a separate thermal interface material (TIM).

In addition, the heat dissipation unit may be formed as an individual structure like the heat pipe, or may be formed on a part of a metal frame of the electronic device by 3D printing or integrally formed with the electromagnetic interference shielding structure. In this case, manufacturing cost may be lowered as compared with the case where a separate heat dissipation unit (heat pipe) is provided.

Figure 1B:
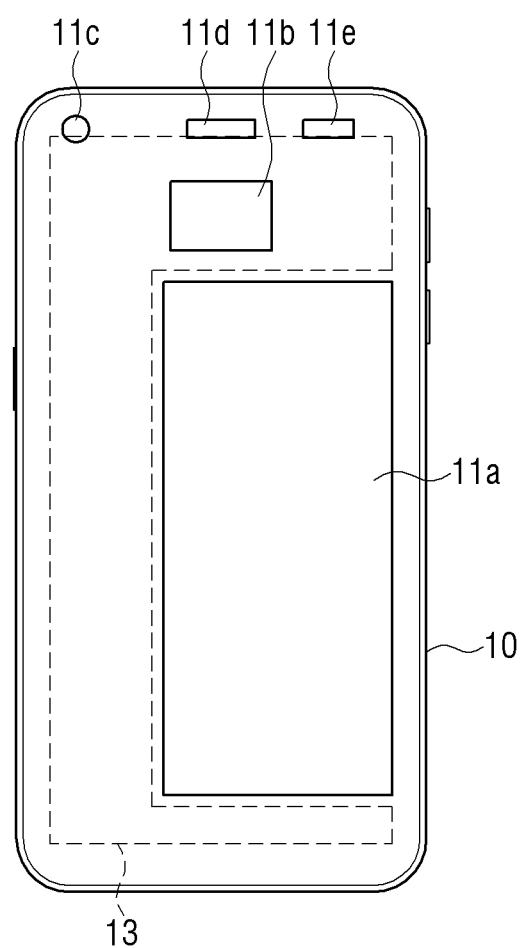
FIG. 1B is a rear view of a metal frame of the mobile phone illustrated in FIG. 1A according to an embodiment of the present disclosure.

FIG. 1A is a perspective view illustrating a mobile phone having an electromagnetic interference shielding structure having a heat dissipation unit according to an embodiment of the present disclosure, and FIG. 1B is a rear view illustrating a metal frame of the mobile phone illustrated in FIG. 1A according to an embodiment of the present disclosure.

The electromagnetic interference shielding structure having the heat dissipation unit according to the embodiment of the present disclosure may be applied to a mobile phone 1 as illustrated in FIG. 1A. The mobile phone 1 may include a metal frame 10 having predetermined rigidity to maintain its overall shape and may include a display 15 for displaying various information.

Figure 2:
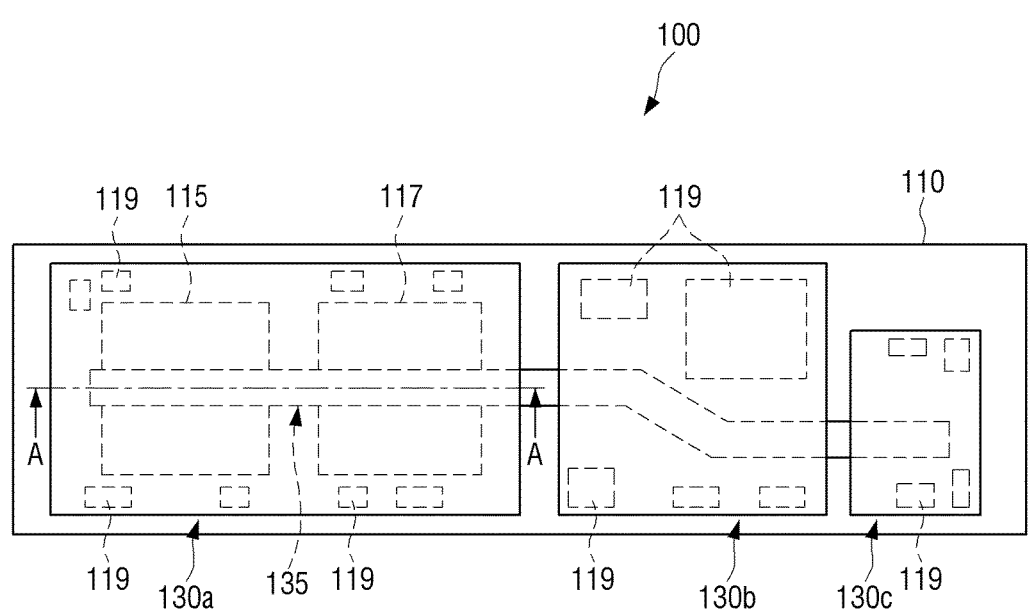
FIG. 2 is a plan view illustrating an example in which a heat dissipation unit is disposed in a plurality of electromagnetic interference shielding structures formed on PCB according to an embodiment of the present disclosure.

Referring to FIG. 1B, the metal frame 10 may be assembled with a battery (not illustrated) and a printed circuit board (PCB) 110 (see FIG. 2). A region 13 indicated by a dotted line in FIG. 1B indicates an area where the PCB may be disposed.

The metal frame 10 may be formed with an empty space 11a to reduce the overall weight and the material cost. Also, a camera lens, a speaker, an illuminance sensor, and the like, which are not illustrated in the figure, may be assembled on the metal frame 10. In this case, the metal frame 10 may be provided with a plurality of holes 11b, 11c, 11d, and 11e in consideration of the shape of the corresponding component.

The metal frame 10 may have an area approximately corresponding to the entire area of the mobile phone 1. Accordingly, the metal frame 10 absorbs heat transferred through the heat dissipation unit (e.g., heat dissipator) 135 (see FIG. 2) and disperses the heat to the whole of the metal frame 10, thereby preventing hot spots from being formed at a specific point. The metal frame 10 is a target for dispersing heat, and therefore may be referred to as a 'heat dissipation target'.

Figure 3:
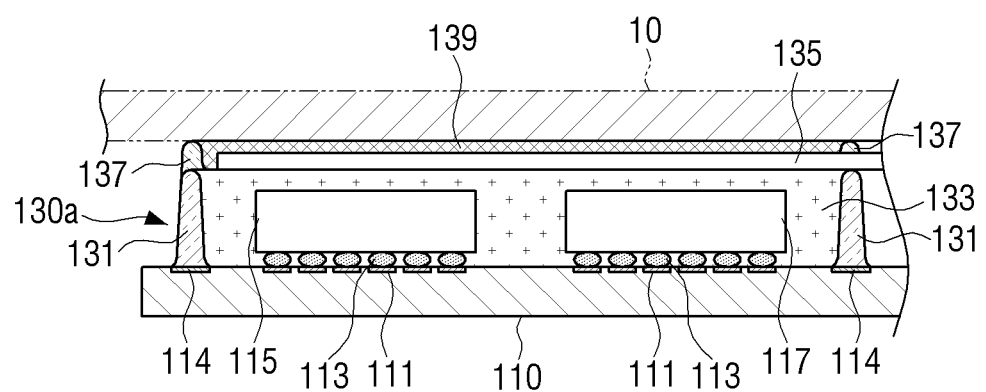
FIG. 3 is a cross-sectional view taken along the line A-A illustrated in FIG. 2 according to an embodiment of the present disclosure.

FIG. 2 is a plan view illustrating an example in which a heat dissipation unit is disposed in a plurality of electromagnetic interference shielding structures formed on a PCB and FIG. 3 is a cross-sectional view taken along the line A-A illustrated in FIG. 2 according to an embodiment of the present disclosure.

Referring to FIG. 2, a plurality of electromagnetic interference shielding structures 130a, 130b, and 130c formed by 3D printing may be formed on the PCB 110 at predetermined intervals according to various embodiments of the present disclosure. The plurality of electromagnetic interference shielding structures 130a, 130b, and 130c shield the plurality of circuit elements (or IC chips) 115, 117, and 119 mounted on the PCB 110. The plurality of circuit elements may be different types of circuit elements, and may be an integrated circuit (IC) chip, a passive device, and a release part. For example, the IC chip may be an AP chip, a memory chip, a radio frequency chip (RF chip), or the like and the passive device may be a resistor, a capacitor, a coil, or the like, and the release part may be a connector, a card socket, an electromagnetic shielding component, or the like.

The heat dissipation unit 135 may be formed as a single unit and may be formed to have a length enough to be embedded in the plurality of electromagnetic interference shielding structures 130a, 130b, and 130c at the same time.

The heat dissipation unit 135 absorbs heat radiated from IC chips 115 and 117 and transfers the heat along a longitudinal direction of the heat dissipation unit 135.

Referring to FIG. 3, a part of the heat dissipation unit 135 may be disposed in an overlapping state at intervals on the IC chips 115 and 117 to be adjacent to the IC chips 115 and 117. At this time, a part of the heat dissipation unit 135 and the IC chips 115 and 117 are disposed in an insulated state by the insulating member 133. However, when a case of the IC chips 115 and 117 is made of a ceramic material, a part of the heat dissipation unit 135 and the IC chips 115 and 117 may be in direct contact with each other.

In addition, another part of the heat dissipation unit 135 embedded in the electromagnetic interference shielding structure 130b disposed in the middle among the plurality of electromagnetic interference shielding structures 130a, 130b and 130c may be bent by a predetermined angle in consideration of mounting positions of the plurality of circuit elements 119 to prevent heat from being transferred to the plurality of circuit elements 119.

Meanwhile, the IC chips 115 and 117 illustrated in FIG. 2 may be shielded together by the electromagnetic interference shielding structure 130a disposed at the leftmost side of the plurality of electromagnetic interference shielding structures 130a, 130b, and 130c. However, the present disclosure is not limited thereto, and the IC chips 115 and 117 may be respectively shielded by different electromagnetic interference shielding structures.

Hereinafter, the electromagnetic interference shielding structure 130a according to the embodiment of the present disclosure will be described with reference to FIG. 3. In addition, the remaining electromagnetic interference shielding structures 130b and 130c are the same as the electromagnetic interference shielding structure 130a to be described below.

Referring to FIG. 3, the electromagnetic interference shielding structure 130a includes the PCB 110 on which IC chips 115 and 117, and the passive device(s) 119 (see FIG. 2) are mounted, a shielding dam 131, an insulating member 133, an edge bridge 137, a shielding layer 139, and the heat dissipation unit 135. Here, the shielding dam 131, the edge bridge 137, and the shielding layer 139 are collectively referred to as a "shielding member".

The plurality of connection pads 111 electrically connected to the plurality of circuit elements 115, 117, and 119, respectively, may be patterned on the PCB 110. The plurality of connection pads 111 are electrically connected to the plurality of circuit elements 115, 117, and 119 to be able to transfer an electrical signal between the respective circuit elements.

A ground pad 114 may be patterned on the PCB 110. The ground pad 114 may be formed on an inside of the PCB 110 in the state in which the upper surface of the ground pad 114 is exposed so that the ground pad 114 does not protrude toward the upper surface of the PCB 110. In this case, the ground pad 114 may be formed integrally with the ground layer (not illustrated) formed in the PCB 110. However, the ground pad 114 is not limited thereto, and may be patterned in a state in which the ground pad 114 finely protrudes on the upper surface of the PCB 110.

The ground pad 114 may be formed for the ground or the signal transmission of the plurality of circuit elements 115, 117, and 119. In this case, the ground pad 114 may be formed in a solid line form or a dotted line form along a path (which may form a closed curve) on which the shielding dam is formed. As the shielding dam 131 may be formed on the ground pad 114, the shielding dam 131 may be grounded to the ground pad 114.

Some of the circuit elements 115 and 117 (hereinafter, referred to as 'IC chips') may include the plurality of connection terminals 113 electrically connected to at least one of the plurality of connection pads 111 of the PCB 110. The plurality of connection terminals 113 may be formed by a ball grid array (BGA) type such as a solder ball. However, the plurality of connection terminals 113 is not limited to the BGA type, and may be formed by various connection types, such as quad flat no lead (QFN), plastic leaded chip carrier (PLCC), quad flat package (QFP), small out line package (SOP), and thin/shrink/thin Shrink SOP (TSOP/SSOP/TSSOP), according to a lead form of the IC chips 115 and 117.

The remaining circuit elements 119 may include at least one connection terminal (not illustrated) electrically connected to the connection pad of the PCB 110. The height of the circuit elements 119 may be smaller or larger than the IC chips 115 and 117 when the circuit elements 119 are mounted on the PCB 110.

The shielding dam 131 may be made of a conductive material having an electromagnetic interference shielding property to prevent electro-magnetic interference (EMI). Accordingly, the shielding dam 131 shields the electromagnetic interferences generated from the plurality of circuit elements 115, 117, and 119, thereby preventing the EMI which may affect other electronic components in the mobile phone 1 including the electromagnetic interference shielding structure 130a. As described above, the mobile phone 1 including the electromagnetic interference shielding structure 130a according to an embodiment of the present disclosure is capable of fundamentally blocking obstacles such as electromagnetic noise and malfunction, thereby preventing the reliability of the product from being deteriorated. In this way, the shielding dam 131 may prevent the effect of the electromagnetic interference, which is inevitably generated during the operation of the circuit elements 115, 117, and 119, on the outside.

The shielding dam 131 is formed in the shape of the closed curve along a path in which the predetermined shielding dam is formed. In this case, the shielding dam 131 may be formed by a free-standing type, which does not depend on a separate structure but take a shape itself. The shielding dam 131 may be formed by an electroconductive material dispensed from a nozzle 216 (see FIG. 4A) to be described later.

The electroconductive material may have high viscosity, and therefore the shape of the electroconductive material dispensed from the nozzle 216 may be kept substantially unchanged without flowing down after being dispensed from the nozzle 216. Thus, when the electroconductive material has the high viscosity, the shielding dam 131 having a high aspect ratio may be formed.

Also, when the PCB is a double-sided board, even if the PCB is turned upside down to form the shielding dam on the back side of the board immediately after forming the shielding dam on the front face of the board, the shielding dam formed in advance on the front face of the board keeps its own shape as it is without flowing down. Therefore, by forming the shielding dam 131 using the electroconductive material having a high viscosity, the entire working process may be performed quickly.

Specifically, the conductive material forming the shielding dam 131 may be made of an electroconductive material. An electroconductive material may include an electroconductive filler and a binder resin.

As the electroconductive filler, metals such as silver (Ag), copper (Cu), nickel (Ni), aluminum (Al), or tin (Sn) may be used, or conductive carbons such as carbon black, carbon nanotube (CNT), or graphite may be used, metal coated materials such as Ag/Cu, Ag/glass fiber and Ni/graphite may be used, or conductive high molecular materials such as polypyrrole and polyaniline may be used. Also, the electroconductive filler may be formed of any one of a flake type, a sphere type, a rod type, and a dendrite type, or a mixture thereof.

As the binder resin, a silicone resin, an epoxy resin, a urethane resin, an alkyd resin, or the like may be used. The material forming the shielding dam 131 may further contain additives (thickener, antioxidant, polymeric surfactant, etc.) and a solvent (water, alcohol, etc.) for improving other performance.

The insulating member 133 insulates the circuit elements 115, 117 and 119 from each other and insulates the respective circuit elements 115, 117 and 119 from the shielding dam 131 and the respective circuit elements 115, 117 and 119 from the shielding layer 139, respectively.

The insulating member 133 is formed by injecting an insulating material into the inside of the shielding dam 131 formed in the shape of the closed loop and then being curing. At this time, the insulating material may be a material having fluidity so that it may adhere to outer surfaces of the circuit elements 115, 117, and 119 and enter a gap formed between the respective circuit elements 115, 117, and 119 and the PCB. The insulating member 133 may be cured through various curing treatments such as room temperature curing, thermal curing, and ultra violet (UV) curing.

The insulating material may be a thixotropy material having fluidity or a phase change (thermoplastic, thermosetting) material. The thixotropy material may include at least one of synthetic fine silica, bentonite, particulate surface treated calcium carbonate, hydrogenated castor oil, metal stearates, aluminum stearate, polyamide wax, oxidized polyethylenes, and linseed polymerized oil. For example, the metal stearates may include aluminum stearate. The phase change material may include at least one of polyurethane, polyurea, polyvinyl chloride, polystyrene, acrylonitrile butadiene styrene (ABS) resin, polyamide, acrylic, epoxy, epoxy, silicone, and polybutylene terephthalate (PBTP).

The heat dissipation unit 135 has the same function as the heat pipe. That is, the heat generated from the IC chips 115 and 117 is absorbed and transferred to the metal frame 10. In this case, since the heat dissipation unit 135 is embedded in the shielding layer 139, the heat is transferred to the metal frame 10 which is in close contact with the upper surface of the shielding layer 139.

The heat dissipation unit 135 may be made of metals (aluminum, tungsten, carbon steel, copper, nickel, or the like) having high thermal conductivity. The specific structure and operation of the heat dissipation unit 135 will be described later with reference to FIGS. 12 to 17.

The edge bridge 137 is made of an electroconductive material having fluidity like the shielding dam 131 and may be made of the same material as the material forming the shielding dam 131. The edge bridge 137 may be made of an electroconductive material dispensed from a separate nozzle (not illustrated).

The edge bridge 137 is formed along an upper end of the shielding dam 131 and therefore may be electrically connected to the shielding dam 131. The edge bridge 137 need not be formed at a high aspect ratio as the shielding dam 131. That is, the shielding layer 139 may be formed at a height enough to completely cover the heat dissipation unit 135. A width of the edge bridge 137 may be greater than or equal to that of the shielding dam 131. If the width of the edge bridge 137 is larger than that of the shielding dam 131, the edge bridge 137 may cover the upper end of the shielding dam 131 and an edge part of the upper surface of the insulating member 133 together.

The edge bridge 137 electrically connects between the shielding layer 139 and the shielding dam 131. Therefore, the edge bridge 137 completely surrounds an outer side of the insulating member 133 together with the shielding dam 131 and the shielding layer 139, so an optimum electromagnetic interference shielding structure can be formed.

The shielding layer 139 is made of a conductive material having fluidity like the shielding dam 131 and may be made of the same material as the material forming the shielding dam 131. The shielding layer 139 is formed on the upper surface of the insulating member 133 dispensed from a nozzle 217 (see FIG. 4D). In this case, the shielding layer 139 is filled in a space provided by the edge bridge 137 formed along the upper part of the shielding dam 131 on the upper part of the insulating member 133.

The shielding layer 139 is filled in the space provided on the upper surface of the insulating member 133 to cover the heat dissipation unit 135 together. The shielding layer 139 may be electrically connected while being in contact with the edge bridge 137 when filled on the upper surface of the insulating member 133.

On the other hand, when the conductive material forming the shielding layer 139 has fluidity but has such a viscosity that it does not flow down from the upper surface of the insulating member 133 after being dispensed from the nozzle, the edge bridge 137 is omitted and the shielding layer 139 may also be formed on the upper surface of the insulating member 133. In addition, among various embodiments according to the present disclosure described below, an embodiment of forming the edge bridge may omit the edge bridge for the same reason as described above.

Hereinafter, the manufacturing process of the electromagnetic interference shielding structure 100 according to the embodiment of the present disclosure will be sequentially described with reference to FIGS. 4 to 8.

FIGS. 4A, 4B, 4C, 4D, and 4E are diagrams sequentially illustrating the manufacturing process of the electromagnetic interference shielding structure illustrated in FIG. 3 according to an embodiment of the present disclosure.

Figure 4A:
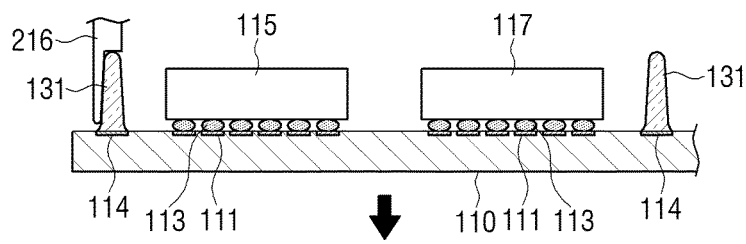
FIGS. 4A, 4B, 4C, 4D and 4E are diagrams sequentially illustrating a manufacturing process of the electromagnetic interference shielding structure illustrated in FIG. 3 according to an embodiment of the present disclosure.
Figure 4B:
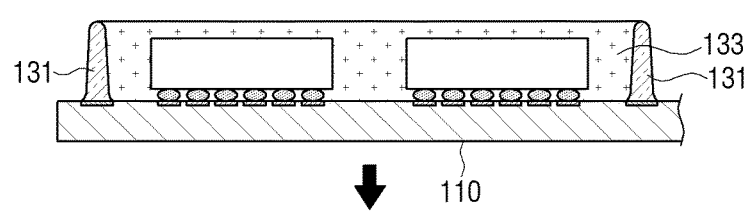
Figure 4C:
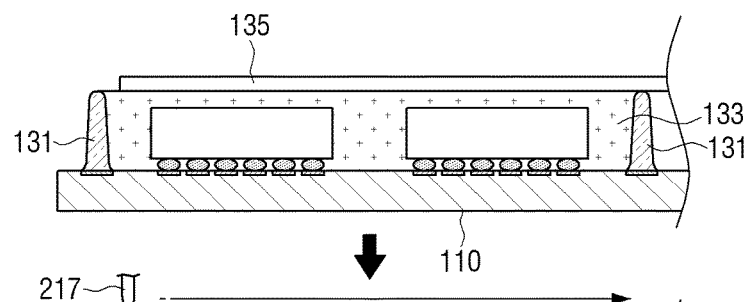
Figure 4D:
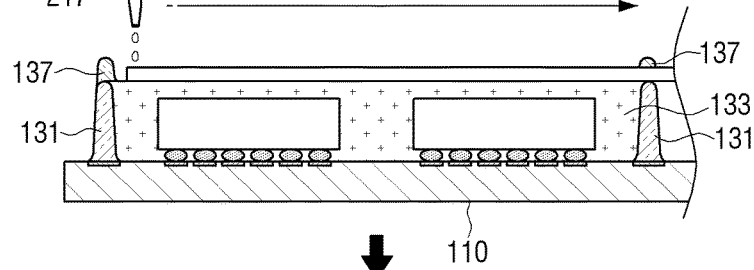
Figure 4E:
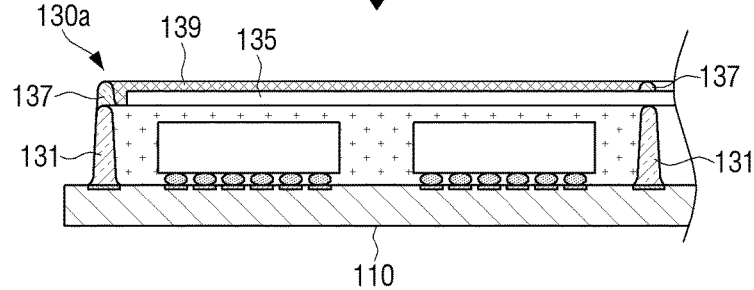
Figure 5:
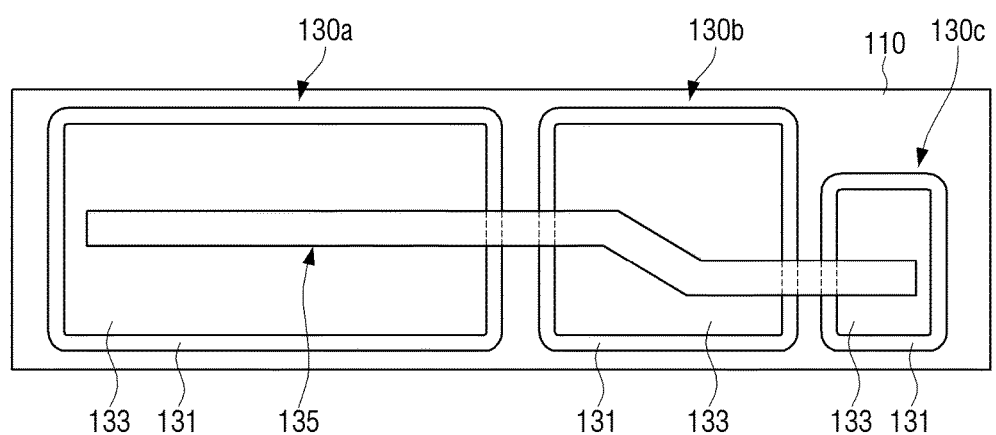
FIG. 5 is a plan view corresponding to FIG. 4C, and is a diagram illustrating an example in which a heat dissipation unit is seated on an upper surface of an insulating member after the insulating member is formed according to an embodiment of the present disclosure.
Figure 6:
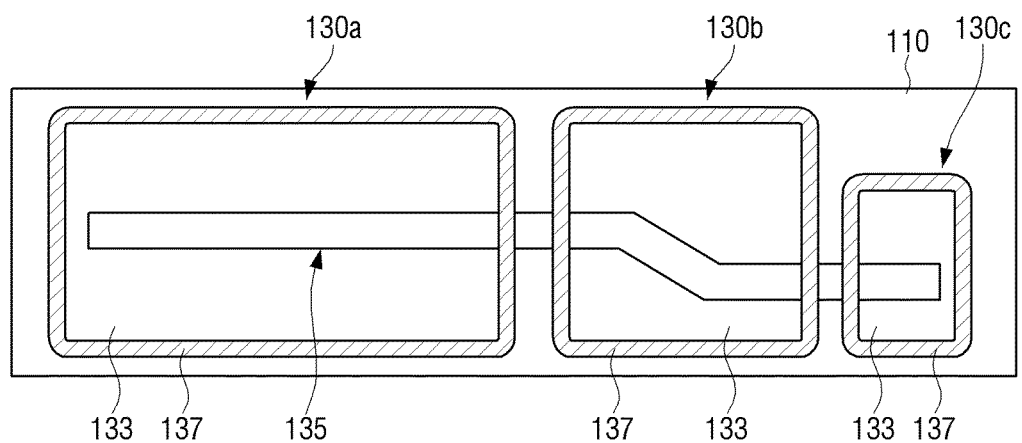
FIG. 6 is a plan view corresponding to FIG. 4D, and is a diagram illustrating an example in which an edge bridge is formed on a shielding dam according to an embodiment of the present disclosure.
Figure 7:
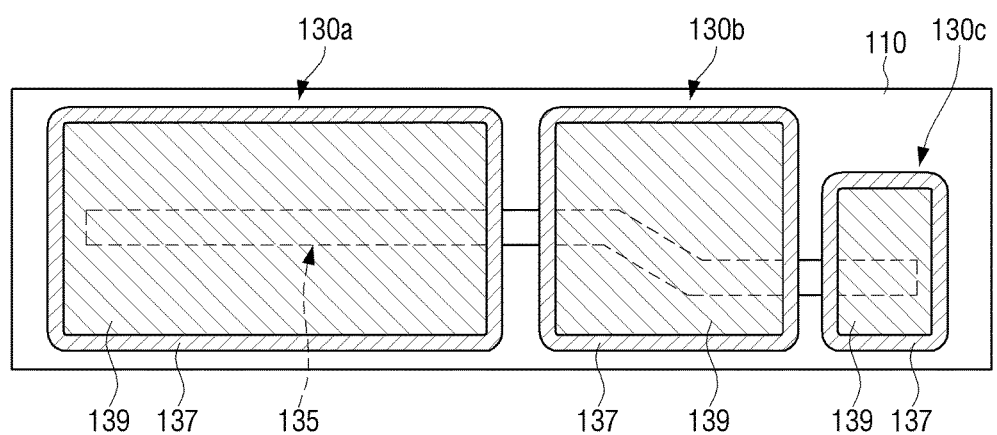
FIG. 7 is a plan view corresponding to FIG. 4E, and is a diagram illustrating an example in which an edge bridge is formed and then a shielding layer is formed according to an embodiment of the present disclosure.

FIGS. 5, 6, and 7 each are plan views corresponding to FIGS. 4C to 4E according to an embodiment of the present disclosure.

Figure 8A:
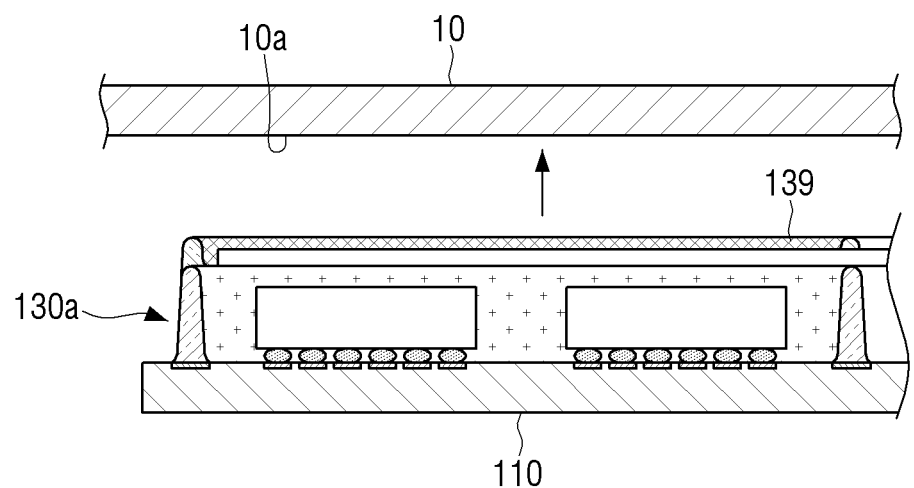
FIGS. 8A and 8B are diagrams illustrating an example in which the electromagnetic interference shielding structure manufactured by the process of FIGS. 4A to 4E adheres to one surface of the metal frame according to an embodiment of the present disclosure.
Figure 8B:
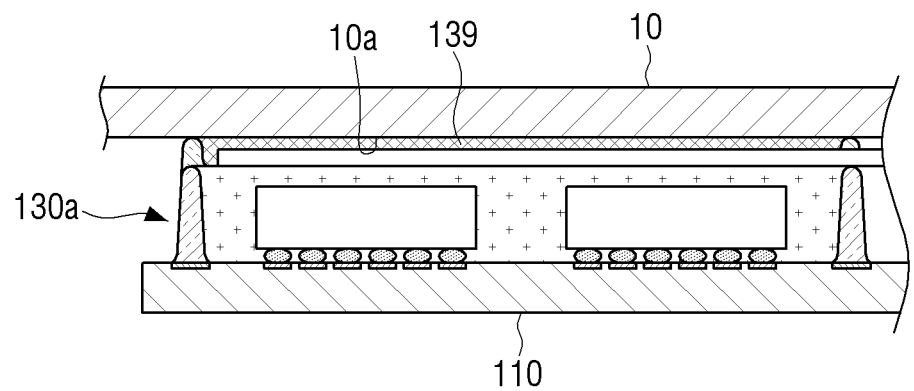

FIGS. 8A and 8B are diagrams illustrating an example in which the electromagnetic interference shielding structure manufactured through the process of FIGS. 4A to 4E is in close contact with one surface of the metal frame according to an embodiment of the present disclosure.

First, the PCB 110 on which the plurality of circuit elements 115, 117, and 119 are mounted is loaded into a working position.

Referring to FIG. 4A, the nozzle 216 moves along a predetermined path to dispense the electroconductive material, so the shielding dam 131 is formed on the upper surface of the PCB 110. The shielding dam 131 may have substantially a closed loop shape to surround the plurality of circuit elements 115, 117, and 119, and is electrically connected to the ground pad 114.

In this case, the nozzle 216 moves to a position where the plurality of electromagnetic interference shielding structures 130a, 130b, and 130c are to be formed, so the shielding dam 131 is formed at each position in the same manner as described above. All the shielding dams 131 of each of the electromagnetic interference shielding structures 130a, 130b and 130c are formed at the same height. This is to form all the insulating members 133 of the electromagnetic interference shielding structures 130a, 130b, and 130c at the same height in the subsequent process.

Referring to FIG. 4B, the insulating material is injected into the spaces provided inside the shielding dam 131, respectively. At this time, the insulating material is dispensed by a separate nozzle (not illustrated) to cover the plurality of circuit elements 115, 117, and 119. If the dispensing of the insulating material is completed, the PCB 110 is put in an oven (not illustrated) and heated for a predetermined time. The insulating material is cured to form the insulating member 133 having a predetermined hardness.

Referring to FIGS. 4C and 5, the heat dissipation unit 135 is seated on the upper surface of the insulating member 133 of each of the electromagnetic interference shielding structures 130a, 130b, and 130c. The heat dissipation units 135 of the respective electromagnetic interference shielding structures 130a, 130b and 130c are formed at the same height, so the bottom surface of the heat dissipation unit 135 may be in close contact with the upper surface of each of the insulating members 133.

Referring to FIGS. 4D and 6, another nozzle (not illustrated) for dispensing the electroconductive material moves along the upper end of the shielding dam 131 to form the edge bridge 137 forming the closed curve. Therefore, the edge bridge 137 covers the upper end of the shielding dam 131 and a part of the heat dissipation unit 135. In this case, the edge bridge 137 is formed so that a part of the edge bridge 137 covering a part of the heat dissipation unit 135 is lower in height than the remaining part of the edge bridge 137. The entire section of the edge bridge 137 is formed at the same height, and thus the height of the shielding layer 139 formed in the subsequent process is evenly formed.

Referring to FIGS. 4E and 7, an electroconductive material is injected into the space formed by the edge bridge 137 of each of the electromagnetic interference shielding structures 130a, 130b, and 130c through the nozzle 217 to form the shielding layer 139. The shielding layer 139 of each of the electromagnetic interference shielding structures 130a, 130b and 130c covers the upper surface of the insulating member 133 and the heat dissipation unit 135. Accordingly, the heat dissipation unit 135 may be embedded in the shielding layer 139. However, the section positioned between the electromagnetic interference shielding structures adjacent to each other in the whole section of the heat dissipation unit 135 may be exposed without being embedded in the electromagnetic interference shielding structure.

Meanwhile, the ground area may extend up to the shielding layer 139 while the shielding dam 131 connected to the ground pad 114 is electrically connected to the shielding layer 139 through the edge bridge 137. Accordingly, each of the electromagnetic interference shielding structures 130a, 130b, and 130c can maintain a stable ground state.

When the electromagnetic interference shielding structures 130a, 130b and 130c are formed on the PCB 110, the PCB 110 is assembled to the metal frame 10 as illustrated in FIG. 8A.

Thus, the upper surface of the shielding layer 139 of each of the electromagnetic interference shielding structures 130a, 130b, and 130c is in surface contact with the one surface 10a of the metal frame 10 as illustrated in FIG. 8B.

In this case, the shielding layer 139 is made of a polymer-based electroconductive material that may have elasticity even after being cured. Accordingly, when the shielding layer 139 and the metal frame 10 may adhere to each other when the shielding layer 139 is in surface contact with the metal frame 10, so that an air gap between the shielding layer 139 and the metal frame 10 may be minimized.

Figure 9:
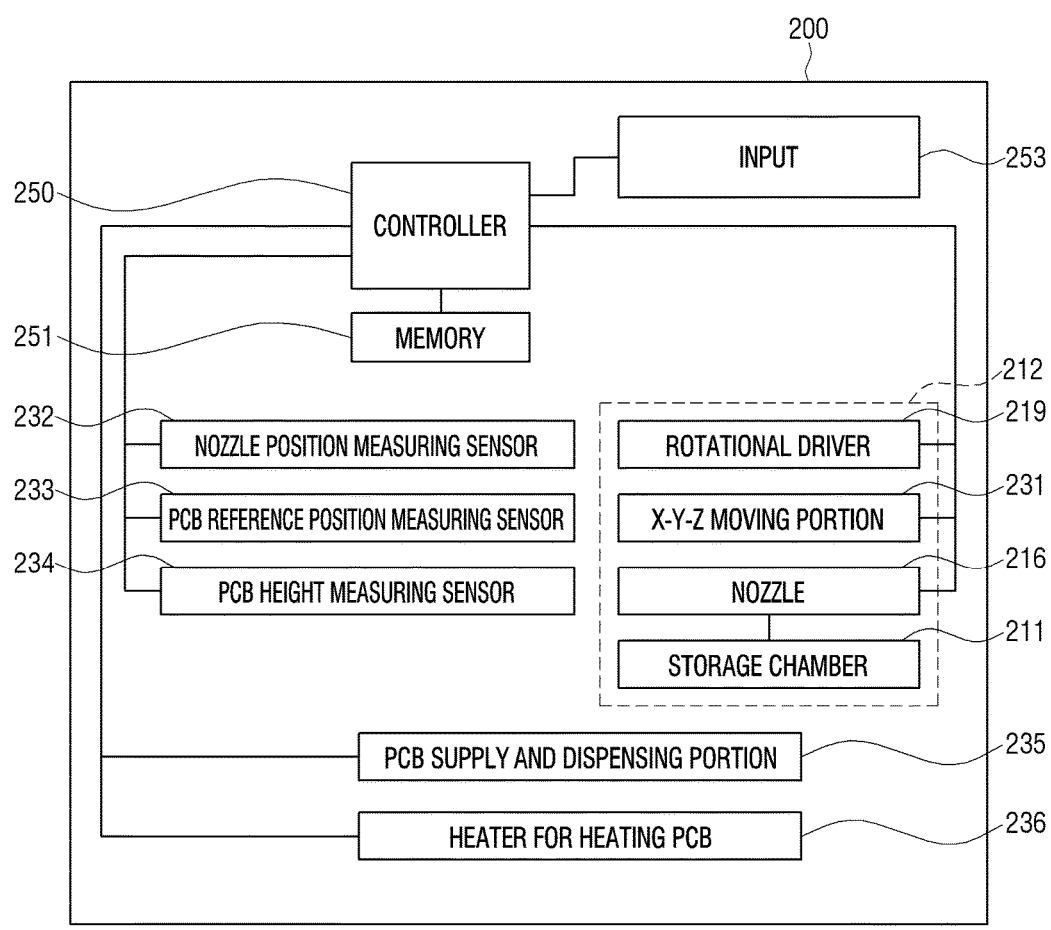
FIG. 9 is a block diagram illustrating a material dispensing apparatus for forming an electromagnetic interference shielding structure according to an embodiment of the present disclosure.

FIG. 9 is a block diagram illustrating a material dispensing apparatus for forming the electromagnetic interference shielding structure described above. Such a material dispensing apparatus may be a 3D printer according to an embodiment of the present disclosure.

The material dispensing apparatus 200 will be described, by way of example, that the nozzle 216 is one, but the present disclosure is not limited thereto. Therefore, the material dispensing apparatus may also include a plurality of nozzles. In particular, nozzles in which a length of the guiding portion 216b (see FIG. 11) is different may be provided to form the edge bridge 137 having a different height from the shielding dam 131 having a high aspect ratio.

Referring to FIG. 9, the material dispensing apparatus 200 may include a dispenser 212 for dispensing a predetermined amount of materials. The dispenser 212 may include a storage chamber 211 for storing a material and a nozzle 216 for dispensing a material supplied from the storage chamber 211.

In addition, the dispenser 212 also includes an X-Y-Z axis moving portion 231 for moving the nozzle 216 in an X-axis direction, a Y-axis direction, and a Z-axis direction and a rotational driver 219 for rotating the nozzle 216 clockwise and counterclockwise or stopping a rotation of the nozzle 216. The X-Y-Z axis moving portion 231 may include a plurality of motors (not illustrated) for moving the nozzle 216 in the X-axis direction, the Y-axis direction, and the Z-axis direction, respectively, and is connected to a nozzle mounting portion (not illustrated) on which the nozzle is mounted for transferring a driving force of the step motors to the nozzle 216. The rotational driver 219 may include a motor (not illustrated) for providing rotational power and an encoder (not illustrated) for controlling a rotational angle of the nozzle 216 by detecting revolutions per minute (RPM) of the motor. The X-Y-Z axis moving portion 231 and the rotational driver 219 are electrically connected to the controller 250 (e.g., at least one processor) and are thus controlled by the controller 250.

In the material dispensing apparatus 200, when an outlet of the nozzle 216 is cleaned or replaced newly, the case where an end of the nozzle through which the material is dispensed does not exactly coincide with the predetermined setting position often occur. Therefore, a nozzle position measuring sensor 232 is provided to set the nozzle 216 to the setting position.

The nozzle position measuring sensor 232 may be a vision camera and is disposed under the nozzle 216 at a predetermined interval. A calibration of the nozzle is performed by reading a position of the end of the nozzle through the image taken by the nozzle position measuring sensor 232 and comparing the read position with an origin value of the nozzle stored in advance in the memory 251 to move the nozzle 216 by X and Y values corresponding to the difference, thereby matching the end of the nozzle with the origin of the nozzle. In this case, the movement of the nozzle 216 is performed by moving the nozzle mounting portion in accordance with the driving of the X-Y-Z moving portion 231.

When the PCB is loaded into the position for forming the shielding dam, the material dispensing apparatus 200 detects the posture in the state of the XY plane on which the PCB is laid to detect a starting point Ap of the nozzle 216 for dispensing the material. To detect the posture after loading of the PCB, the material dispensing apparatus 200 may include a PCB reference position measuring sensor 233 and a PCB height measuring sensor 234.

As the PCB reference position measuring sensor 233, a vision camera as a sensor for determining a PCB loading position may be used. The PCB reference position measuring sensor 233 detects whether the PCB loaded into the working space is in a predetermined position or how far the PCB is out of a predetermined position to form the shielding structure. For example, if the PCB is loaded into the working position, the controller 250 moves the PCB reference position measuring sensor 233 to the coordinates of a first reference mark set in advance to photograph the first reference mark of the current PCB and then compares the first reference mark currently photographed with a shape of the first reference mark set in advance, thereby determining whether the PCB reference position measuring sensor 233 is in position.

If it is determined that the PCB reference position measuring sensor 233 is in position, the controller 250 calculates the position difference between the coordinates of the current first reference mark and the coordinates of the first reference mark set in advance. Next, the controller 250 calculates the positional difference between the coordinates of the current second reference mark and the coordinates of the second reference mark that are set in advance, similarly to the method of calculating the coordinates of the first reference mark.

To form the shielding dam on the PCB, the material dispensing apparatus 200 may include a PCB supply and dispensing portion 235 that loads the PCB into the working position and unloads the PCB after the formation of the shielding dam is completed.

The material dispensing apparatus 200 may include a heater 236 for heating PCB for raising the PCB to a predetermined temperature to shorten a drying time of the formed shielding dam.

The material dispensing apparatus 200 may include an input 253 through which a user may directly input a moving path of the nozzle 216.

The input 253 may be formed as a touch screen capable of touch input or a typical keypad. A user may input the path of the nozzle through the input 253, and the nozzle path is input once, and the input nozzle path data is stored in the memory 251. Thereafter, it goes without saying that the nozzle path data can be modified.

The process of inputting the nozzle path through the input 253 is as follows.

First, at least two reference marks displayed on the PCB loaded into the working position via the PCB reference position measuring sensor 233 (e.g., vision camera) are photographed, distance values between the images of the respective references and the two reference marks is measured, and the two reference marks is stored in a memory 251 after the distance between the two reference marks is measured. If the PCB is rectangular, the two reference marks may be displayed at an upper left end and a lower right end of the. In this case, the distance between the two reference marks may represent a linear length approximately in a diagonal direction of the PCB.

Specifically, when the PCB is loaded into the working position, the user may move the vision camera to the position (e.g., based on center of the first reference mark or a part of the first reference mark) at which the first reference mark of the upper left end is present via front, rear, left, and right moving buttons provided on the input 253 and then presses a memory button provided on the input 253. In this case, the controller 250 calculates a distance of the first reference mark from a preset origin point (0, 0, 0) to obtain coordinates (X1, Y1, Z1) of the first reference mark and store the obtained coordinates of the first reference mark in the memory. The photographing position of the vision camera moving with the nozzle is offset from the center of the nozzle by a certain distance. Therefore, the coordinates (X1, Y1, Z1) of the first reference mark are calculated by calculating up to the offset value by the controller 250. Further, when the user presses the photographing button, the image of the first reference mark is stored in the memory 251.

Next, the user may move the vision camera to the position (e.g., based on center of the second reference mark or a part of the second reference mark) at which the second reference mark of the upper right end is present via front, rear, left, and right moving buttons provided on the input 253 and then presses a memory button provided on the input 253. In this case, the controller 250 calculates a distance of the second reference mark from a preset origin point (0, 0, 0) to obtain coordinates (X2, Y2, Z2) of the second reference mark and store the obtained coordinates of the second reference mark in the memory. Further, when the user presses the photographing button, the image of the second reference mark is stored in the memory 251. The coordinates (X2, Y2, Z2) of the second reference mark are calculated by calculating up to the offset value by the controller 250, like the process of calculating the coordinates (X1, Y1, Z1) of the first reference mark described above.

The controller 250 calculates the interval between the two positions using the positions of the first and second reference marks detected as described above, and stores the calculated interval in the memory 251.

Next, the user inputs a plurality of coordinates located on the moving path of the nozzle while moving the vision camera along the path of the shielding dam to be formed on the PCB by using the front, rear, left, and right moving buttons of the input 253 to confirm the real-time image photographed by the vision camera with the naked eye. When the vision camera is positioned at any one point on the moving path, if the coordinate input button provided on the input 253 is pressed, the corresponding coordinates are input. The so input coordinates are stored in the memory 251.

The plurality of coordinates corresponds to coordinates Ap (see FIG. 10) of the point at which the nozzle starts dispensing the material, coordinates (which may be disposed substantially adjacent to a starting point Ap when the shielding dam forms a closed curve) of the point at which the nozzle finishes dispensing, and each coordinate for points Bp, Cp, Dp, Ep, and Fp (see FIG. 10) at which the nozzle should change direction during the movement.

In addition, to program the moving path of the nozzle, the input 253 may include various command buttons such as a moving button for moving the nozzle to the designated coordinates, a line button for issuing a command to move the nozzle while dispensing the material, and a rotational button for switching a moving direction of the nozzle. The user may generate the moving path of the nozzle by matching the coordinates and the rotational angle with the command buttons.

When the moving path of the nozzle is programmed by the user as described above, the controller 250 may automatically form the shielding dam on the PCB by dispensing the material while moving the nozzle along the moving path.

In this way, the nozzle path data input through the input 253 may be stored in the memory 251. The controller 250 operates the X-Y-Z axis moving portion 231 and the rotational driver 219 according to the nozzle path data stored in the memory 251 to move the nozzle along the path input in advance. The nozzle path data includes the distance by which the nozzle 216 moves in a linear direction along the upper surface of the PCB 110 and the rotational direction and angle of the nozzle 216.

Meanwhile, the present embodiment describes that the user directly inputs the moving path of the nozzle through the input 253. However, the present disclosure is not limited thereto, and the nozzle moving path may be stored in advance in the memory 251. In this case, a plurality of nozzle moving paths corresponding to the respective patterns may be stored in advance to correspond to the pattern of the shielding dam variously formed according to products. In addition to the moving path of the nozzle, calibration information, reference position information of the nozzle, PCB reference position information, PCB reference height information, and the like may be pre-stored in the memory 251 through the input 253.

Figure 10:
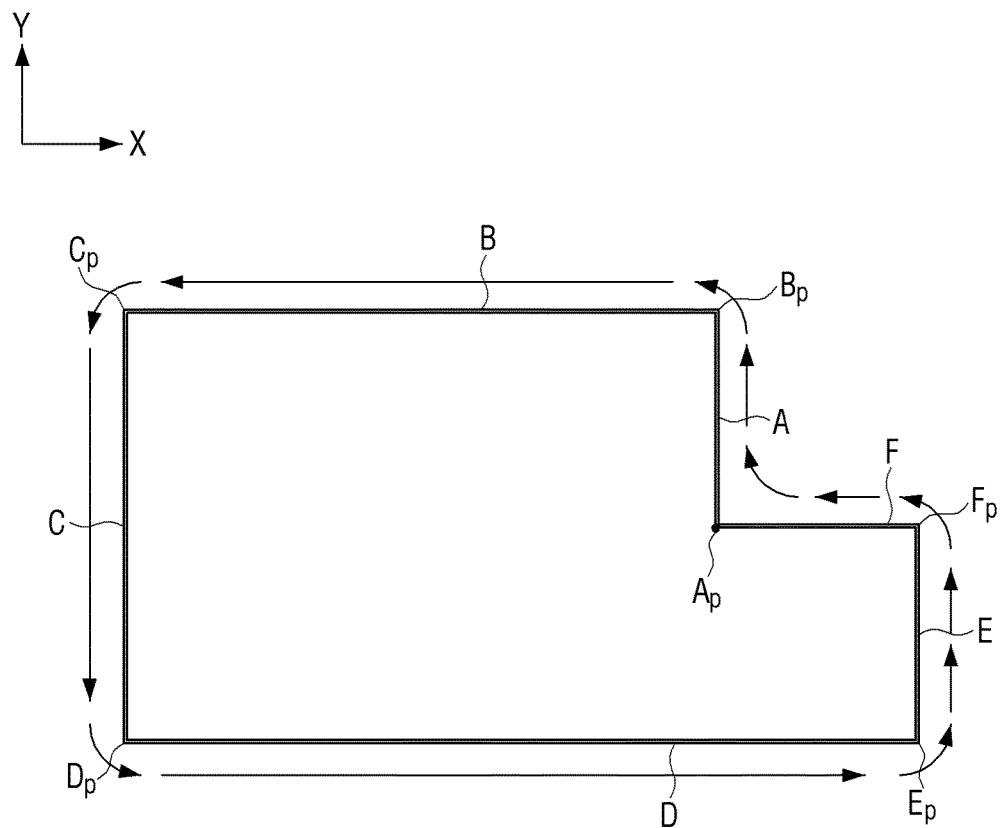
FIG. 10 is a diagram illustrating a moving path of a nozzle input through an input provided in the material dispensing apparatus according to an embodiment of the present disclosure.

FIG. 10 is a diagram illustrating a moving path of a nozzle input through an input provided in the material dispensing apparatus according to an embodiment of the present disclosure.

The nozzle 216 can move along the path for forming the shielding dam by the nozzle path data, and a specific example thereof will be described with reference to FIG. 10.

The nozzle 216 is set at coordinates corresponding to the starting point Ap. At this time, the controller 250 rotates the nozzle 216 by a predetermined angle by determining the direction in which the molding member (not shown) is disposed and operating the rotational driver 219 so that an inner surface of the guide portion/unit 216b faces a side surface of the insulating member 133.

As such, the nozzle 216 set at the coordinates corresponding to the starting point Ap linearly moves by section A in a +Y-axis direction by the X-Y-Z axis moving portion 231. Then, the nozzle 216 moves along the section where the path is bent (section including the point Bp connecting between the section A and the section B). In this case, the nozzle 216 is rotated by the rotational driver 219 so that the inner side of the guide portion 216b continues to face the insulating member 133, while moving along the nozzle path by the X-Y-Z-axis moving portion 231.

When passing through the section where the path is bent, the nozzle 216 moves linearly by the section B in an −X-axis direction by the X-Y-Z axis moving portion 231. As described above, when the nozzle 216 sequentially repeats linear movement and rotation in the remaining sections B, C, D, E and F by the rotational driver 219 and the X-Y-Z axis moving portion 231 to return to the starting point Ap, the path movement of the nozzle 216 is completed.

Figure 11:
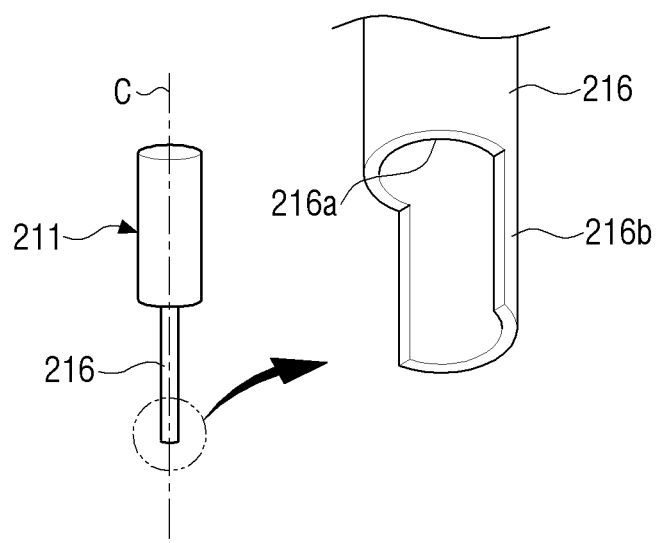
FIG. 11 is a diagram illustrating a nozzle of the material dispensing apparatus according to an embodiment of the present disclosure.

FIG. 11 is a diagram illustrating an outlet through which a material for forming a shielding dam is dispensed through the nozzle of the material dispensing apparatus according to an embodiment of the present disclosure.

Referring to FIG. 11, the nozzle 216 moves by the X-Y-Z-axis moving portion 231 and a material is dispensed through an outlet 216a while the nozzle is rotated by the rotational driver 219.

The outlet 216a is formed toward a lower side of the nozzle 216 and the guide portion 216b extends downward from a lower end of the outlet 216a along a longitudinal direction of the nozzle 216.

When the nozzle 216 is set at a position for dispensing the material as illustrated in FIG. 3 to form the shielding dam 131 along the side of the insulating member 133, a part of the outlet 216a is positioned on the upper surface of the insulating member 133 so that a part (edge) of the upper surface of the insulating member 133 may be covered with a material. The guide portion 216b is disposed between the insulating member 133 and the circuit element and disposed so as not to interfere with the insulating member 133 and the circuit element when the nozzle 216 is moved.

The guide portion 216b prevents the material dispensed from the outlet 216a from spreading in a direction away from the insulating member 133 to guide the material to be attached to the insulating member 133, while guiding the material dispensed from the outlet 216a to move to the lower side of the insulating member 133.

The nozzle 216 forms the shielding dam 131 on the side surface and the upper surface of the insulating member 133 while moving along a predetermined path to form the shielding dam 131, and at the same time, guides a material to the ground pad 114 to contact the ground pad 114.

Hereinafter, the detailed structure and operation of the heat dissipation unit 135 will be described with reference to FIGS. 12 to 17.

Figure 12:
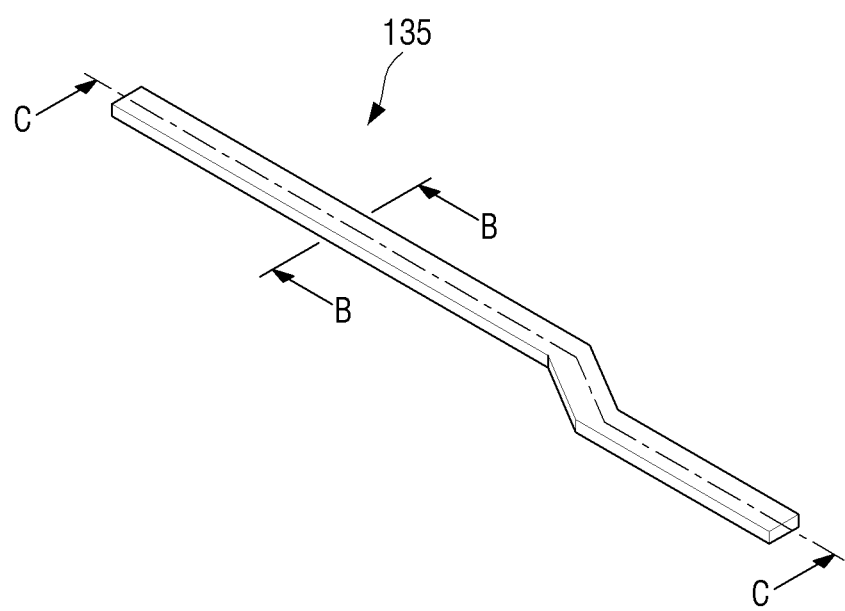
FIG. 12 is a perspective view illustrating the heat dissipation unit illustrated in FIG. 2 according to an embodiment of the present disclosure.

FIG. 12 is a perspective view illustrating the heat dissipation unit illustrated in FIG. 2 according to an embodiment of the present disclosure.

Figure 13:
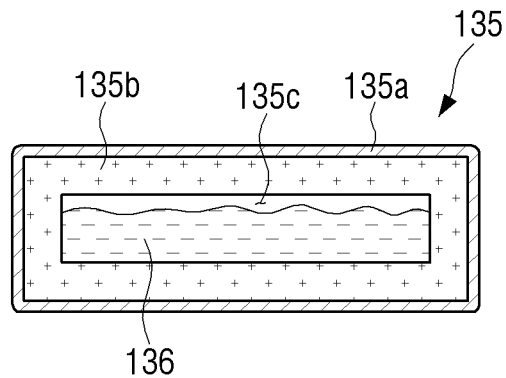
FIG. 13 is a cross-sectional view taken along the line B-B illustrated in FIG. 12 according to an embodiment of the present disclosure.

FIG. 13 is a cross-sectional view taken along line B-B illustrated in FIG. 12 according to an embodiment of the present disclosure.

Figure 14:
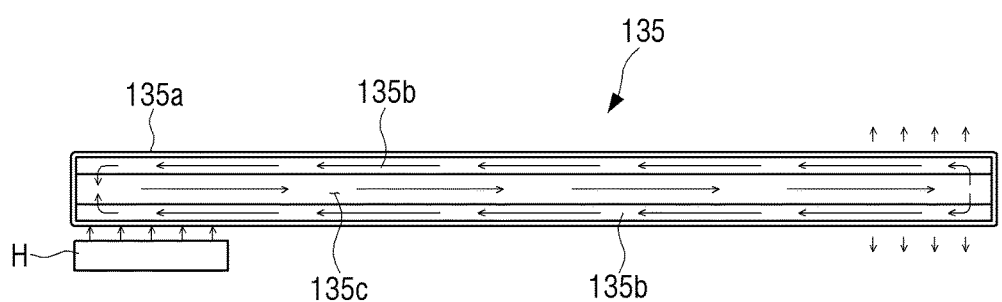
FIG. 14 is a cross-sectional view taken along the C-C line illustrated in FIG. 12, and is a diagram illustrating an example in which a volatile material injected into the heat dissipation unit moves along an inside of the heat dissipation unit while being repeatedly vaporized and liquefied due to heat radiated from a heat source to be according to an embodiment of the present disclosure.

FIG. 14 is a cross-sectional view taken along line C-C illustrated in FIG. 12 according to an embodiment of the present disclosure.

Referring to FIG. 12, the heat dissipation unit 135 may be formed in a narrow and long shape to have a predetermined length. The length and width of the heat dissipation unit 135 may vary depending on the number and arrangement of electromagnetic interference shielding structures.

Referring to FIG. 13, the heat dissipation unit 135 may include a metal case 135a, a porous member 135b, and a volatile material 136.

The metal case 135a may be formed in a tube shape having a rectangular shape whose width in cross section is larger than a height. This is to minimize the height of the heat dissipation unit 135 to reduce the heights of the electromagnetic interference shielding structures 130a, 130b, and 130c.

The porous member 135b may be manufactured by sintering metal powder to form fine holes that are connected to each other. The porous member 135b may be disposed along the inner side of the metal case 135a and may have substantially a tubular shape to form a space 135c on the inner side. The inner space 135c of the porous member 135b is used as a passage through which the vaporized volatile material 136 moves and a plurality of fine holes of the porous member 135b are used as a passage through which the liquefied volatile material 136 moves.

The volatile material 136 exists in a liquid state at room temperature and is vaporized by high-temperature heat emitted from the IC chips 115 and 117. The vaporization temperature of the volatile material 136 is preferably lower (about 20° C. to 30° C.) than the human body temperature (about 35° C. to 37° C.). This is for preventing hot spots by dispersing heat to the entire mobile phone 1 before hot spots appear on the mobile phone 1 due to the heat emitted from the IC chips 115 and 117.

Referring to FIG. 14, the heat dissipation unit 135 has one side adjacent to the heat source H and the other side away from the heat source. Here, the heat source H refers to the IC chips 115 and 117 described above.

When the temperature of the heat emitted from the heat source H becomes 20° C. or higher, the volatile material 136 is vaporized. Gas transfers heat to the metal case 135a while moving in a direction away from the heat source H (direction from left to right in FIG. 14) through the inner space 135c of the porous member 135b as illustrated in FIG. 14, and the temperature of the gas is gradually lowered, such that the gas is liquefied. Accordingly, the volatile material 136 changed into the liquid is sucked into the porous member 135b by a capillary phenomenon at a part farthest from the heat source, and then moves to a place adjacent to the heat source through the plurality of fine holes. As described above, the volatile material 136 circulates one side and the other side of the heat dissipation unit 135 inside the heat dissipation unit 135 while being alternately changed into gas and liquid.

In this case, the amount of volatile material 136 injected into the heat dissipation unit 135 is preferably about 40% to 80% with respect to the volume of the space formed inside the heat dissipation unit 135. If the injection amount of the volatile material 136 exceeds 80%, the circulation of the volatile material may not be performed smoothly, and if it is less than 20%, the heat transfer efficiency may be reduced significantly.

Thus, the heat dissipation unit 135 transfers the heat emitted from the IC chips 115 and 117 corresponding to the heat source to the metal frame 10 by the circulation of the volatile material. In addition, the heat dissipation unit 135 may transfer even the heat emitted from the inside of the remaining electromagnetic interference shielding structures in which the IC chips 115 and 117 are not shielded to the metal frame 10 through the heat dissipation unit 135.

Figure 15:
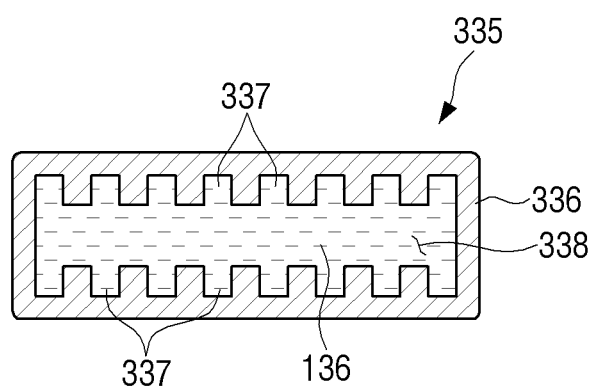
FIGS. 15 and 16 are sectional views illustrating other examples of the heat dissipation unit according to an embodiment of the present disclosure.
Figure 16:
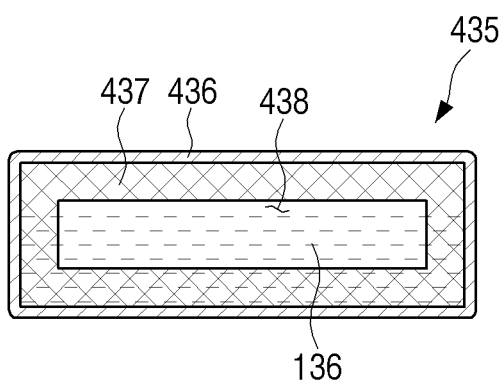

FIGS. 15 and 16 are sectional views illustrating other examples of the heat dissipation unit according to an embodiment of the present disclosure.

The heat dissipation unit 135 uses the porous member 135b, which is formed by sintering, as a circulation passage of the volatile material 136. However, the circulation passage of the volatile material 136 is not limited thereto and may be variously shaped.

Referring to FIG. 15, a heat dissipation unit 335 (e.g., heat dissipator) may form as the passage of the liquefied volatile material 136 a plurality of channels 337 along the longitudinal direction of the metal case 336 on the inner side of the metal case 336. The plurality of channels 337 may be of a narrow and long groove shape so that liquid can move. The plurality of channels 337 may be integrally formed in the metal case 336 by forging or extrusion. The liquefied volatile material is stored in a space 338 formed inside the metal case 336. The space 338 is used as a passage through which the vaporized volatile material moves when heat is applied from the outside to the metal case 336.

Referring to FIG. 16, in a heat dissipation unit 435, a net member 437 may be provided inside the metal case 436. The net member 437 is used as a passage through which the liquefied volatile material 136 moves. The liquefied volatile material is stored in a space 438 formed inside the metal case 437. The space 338 is used as a passage through which the vaporized volatile material moves when heat is applied from the outside to the metal case 336.

The present disclosure describes that the heat dissipation units 335 and 435 illustrated in FIGS. 15 and 16 have a rectangular cross section by way of example, but is not limited thereto. Therefore, the cross section of the heat dissipation unit may have a circular shape or an oval shape.

Figure 17:
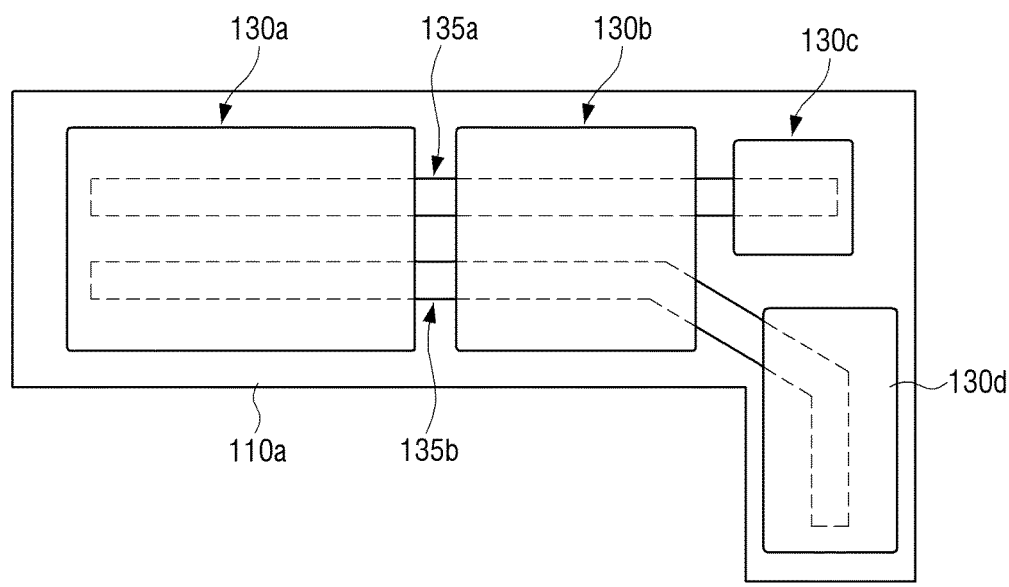
FIG. 17 is a plan view illustrating an example in which a plurality of heat dissipation units is applied to an electromagnetic interference shielding structure according to an embodiment of the present disclosure.

FIG. 17 is a plan view illustrating an example in which a plurality of heat dissipation units is applied to an electromagnetic interference shielding structure.

In the above-described electromagnetic interference shielding structure, one heat dissipation unit 135 is applied. However, the present disclosure is not limited thereto, and as illustrated in FIG. 17, the plurality of heat dissipation units 135a and 135b can be applied. In this case, the plurality of heat dissipation units 135a and 135b may have various shapes according to the arrangement of the plurality of electromagnetic interference shielding structures 130a, 130b, 130c, and 130d.

The first heat dissipation unit 135a of the plurality of heat dissipation units is embedded in the first to third electromagnetic interference shielding structures 130a, 130b and 130c substantially arranged in a row, and the second heat dissipation unit 135b is embedded in the first, second, and fourth electromagnetic interference shielding structures 130a, 130b, and 130d. A part of the first and second heat dissipation units 135a and 135b may be embedded in the same electromagnetic interference shielding structures 130a and 130b at the same time, and the remaining parts thereof may be embedded in the electromagnetic interference shielding structures 130c and 130d, respectively.

As described above, the electromagnetic interference shielding structure according to an embodiment of the present disclosure does not use a separate TIM, and the electromagnetic interference shielding structure is formed by the 3D printing, so the electromagnetic interference shielding structure may be easily manufactured and the manufacturing cost thereof may be reduced. Further, the heat dissipation unit is embedded in the shielding layer forming a part of the electromagnetic interference shielding structure and the shielding layer is disposed to be in direct contact with the metal frame, so the thickness of the mobile phone may be reduced.

Meanwhile, although it is described that the electromagnetic interference shielding structures 130a, 130b, 130c and 130d have the structure in which the heat dissipation unit 135 is completely embedded in the shielding layer 139, the present disclosure is not limited thereto. Therefore, the electromagnetic interference shielding structure can be of course configured so that a part of the heat dissipation unit 135 is inserted into the shielding layer and the remaining portion thereof is inserted into the metal frame. The configuration will be described below with reference to FIG. 18.

Figure 18:
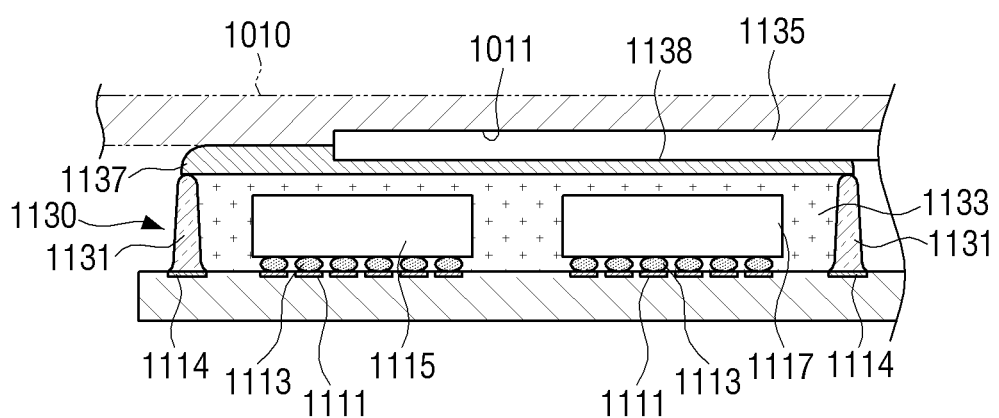
FIG. 18 is a cross-sectional view illustrating an electromagnetic interference shielding structure having a heat dissipation unit according to another embodiment of the present disclosure according to an embodiment of the present disclosure.

FIG. 18 is a cross-sectional view illustrating an electromagnetic interference shielding structure having a heat dissipation unit according to another embodiment of the present disclosure.

Referring to FIG. 18, an electromagnetic interference shielding structure 1130 according to another embodiment of the present disclosure is manufactured by almost the same processes as the foregoing electromagnetic interference shielding structures 130a, 130b, 130c, and 130d. However, the electromagnetic interference shielding structure 1130 according to another embodiment of the present disclosure is different from the foregoing electromagnetic interference shielding structures 130a, 130b, 130c, and 130d in that the heat dissipation unit (or heat dissipator) 1135 is disposed between a shielding layer 1137 and a metal frame 1010 or is disposed to be simultaneously inserted into the shielding layer 1137 and the metal frame 1010. Therefore, in the description of the electromagnetic interference shielding structure 1130, the same components as those of the electromagnetic interference shielding structures 130a, 130b, 130c, and 130d described above will not be described, and mainly different components will be described.

In the electromagnetic interference shielding structure 1130, a shielding layer 1137 is formed with an insertion groove 1138 into which a first part of the heat dissipation unit 1135 is inserted. In addition, an insertion groove 1011 is formed on one surface of the metal frame 1010 into which a second part of the heat dissipation unit 1135 not inserted into the insertion groove 1138 is inserted.

In this case, a sum of thicknesses of the insertion groove 1138 of the shielding layer 1137 and the insertion groove 1011 of the metal frame 1010 may be formed to be similar to the thickness of the heat dissipation unit 1135. As described above, the heat dissipation unit 1135 is fixed in a state where both sides thereof are each inserted into the insertion grooves 1138 and 1011, respectively.

The first part of the heat dissipation unit 1135 may be inserted while adhering to the insertion groove 1138 of the shielding layer 1137 having elasticity, so a contact area can be maximally maintained without an air gap between the first part and the insertion groove 1138.

On the other hand, since a second part of the heat dissipation unit 1135 is in contact with the metal frame 1010 whose elasticity is significantly lower than that of the shielding layer 1137, there is a possibility that the air gap occurs between the second part and the insertion groove 1011. To minimize the air gap, a TIM (not illustrated) in a paste state may be applied between the second part and the insertion groove 1011.

Hereinafter, the manufacturing process of the electromagnetic interference shielding structure 1130 will be sequentially described with reference to FIGS. 19 to 21.

Figure 19A:
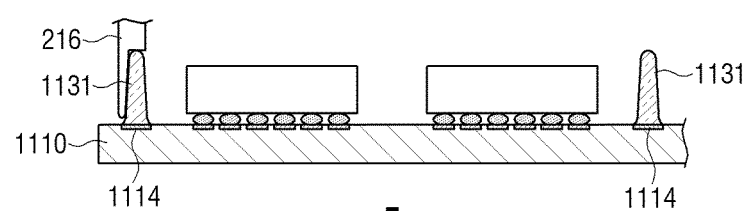
FIGS. 19A, 19B, and 19C are diagrams sequentially illustrating a manufacturing process of the electromagnetic interference shielding structure illustrated in FIG. 18 according to an embodiment of the present disclosure.
Figure 19B:
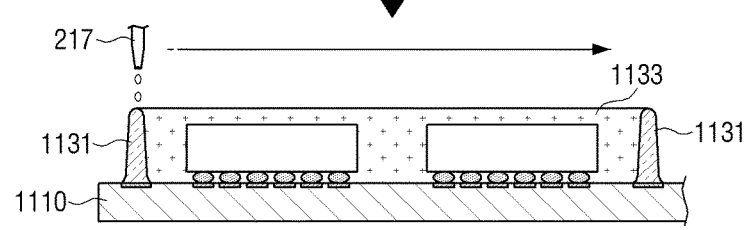
Figure 19C:
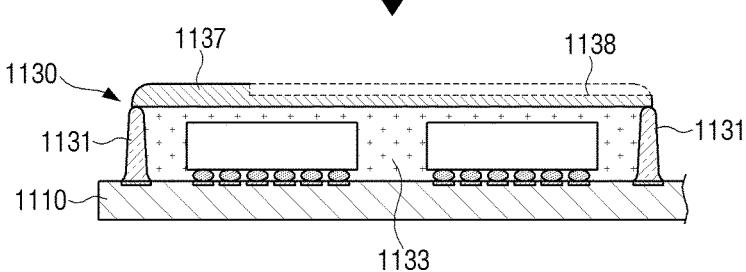

FIGS. 19A, 19B, and 19C are diagrams sequentially illustrating a manufacturing process of the electromagnetic interference shielding structure illustrated in FIG. 18 according to an embodiment of the present disclosure.

Figure 20:
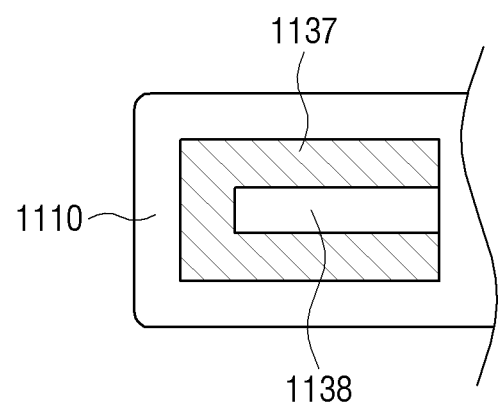
FIG. 20 is a plan view corresponding to FIG. 19C, and is a diagram illustrating an example of a shielding layer having an insertion groove into which a heat dissipation unit is inserted according to an embodiment of the present disclosure.

FIG. 20 is a plan view corresponding to FIG. 19C, and is a diagram illustrating an example of a shielding layer having an insertion groove into which a heat dissipation unit is inserted according to an embodiment of the present disclosure.

Figure 21:
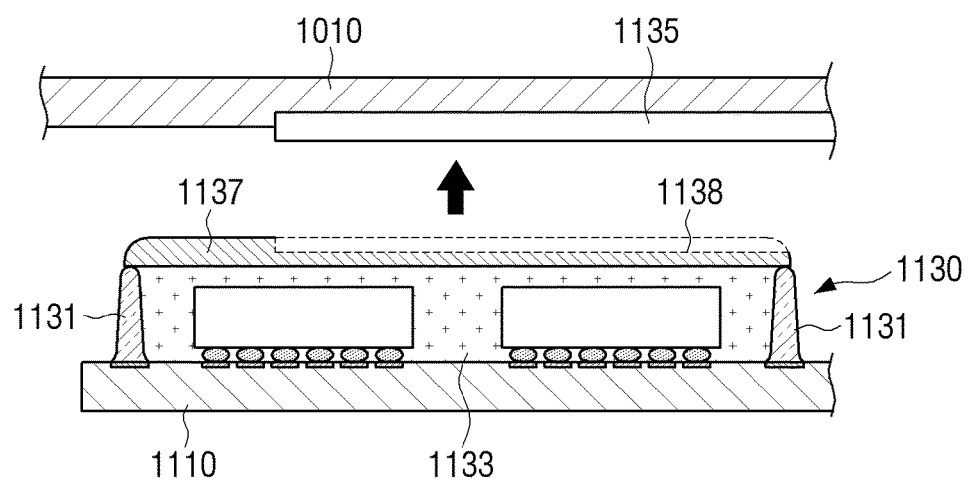
FIG. 21 is a diagram illustrating an example of assembling the electromagnetic interference shielding structure formed through the process of FIGS. 19A to 19C so that the heat dissipation unit partially inserted into the metal frame is inserted into the combined insertion groove of the shielding layer according to an embodiment of the present disclosure.

FIG. 21 is a diagram illustrating an example of assembling the electromagnetic interference shielding structure formed through the process of FIGS. 19A to 19C so that the heat dissipation unit partially inserted into the metal frame is inserted into the combined insertion groove of the shielding layer according to an embodiment of the present disclosure.

Referring to FIG. 19A, the electromagnetic interference shielding structure 1130 includes a shielding dam 1131 in a form of a closed curve on a PCB 1110 on which a plurality of circuit elements is mounted using an electroconductive material dispensed from the nozzle 216. Next, the insulating material is injected into the space formed by the shielding dam 1131 to form an insulating member 1133 covering the plurality of circuit elements.

Referring to FIG. 19B, a shielding layer 1137 which can cover an upper end of the shielding dam 1131 and an upper surface of the insulating member 1133 at the same time is formed by using the electroconductive material dispensed from the nozzle 217.

Referring to FIGS. 19C and 20, the shielding layer is formed to be stepped from the surrounding of the insertion groove 1138 by limiting the dispensed amount of the electroconductive material in the region corresponding to the insertion groove 1138 so that the insertion groove 1138 may be formed in the shielding layer 1137. Although not illustrated in the drawing, even in the case of the remaining electromagnetic interference shielding structures formed on the remaining PCB 1110, the insertion groove into which the heat dissipation unit 1135 may be inserted are each formed in the same manner as the foregoing method when the shielding layer is formed.

On the other hand, one surface of the metal frame 1010 is formed with an insertion groove 1011 into which the second part of the heat dissipation unit 1135 is inserted. In this case, the insertion groove 1011 may be formed to correspond to the shape of the heat dissipation unit 1135.

After an appropriate amount of TIM in a paste form is applied to the inside of the insertion groove 1011, as illustrated in FIG. 21, the second part of the heat dissipation unit 1135 is inserted into the insertion groove 1011. Therefore, the air gap that may be formed between the heat dissipation unit 1135 and the metal frame 1010 may be eliminated or minimized and the contact area between the heat dissipation unit 1135 and the metal frame 1010 is maximized.

As described above, the PCB 1110 is assembled to the metal frame 1010 in a state where the second part of the heat dissipation unit 1135 is inserted into the insertion groove 1011 of the metal frame 1010. In this case, the first part of the heat dissipation unit 1135 may be inserted into the insertion groove 1138 of the plurality of electromagnetic interference shielding structures/members 1130.

In FIG. 18, non-explained reference numeral 1111 denotes a connection pad, reference numeral 1113 denotes a connection terminal, reference numeral 1114 denotes a ground pad, and reference numerals 1115 and 1117 denote integrated circuit (IC) chips.

The heat dissipation units 135 and 1135 applied to the electromagnetic interference shielding structure described above have a separate structure. Hereinafter, an example in which the heat dissipation unit is formed on a part of the metal frame by the 3D printing, and an example in which the heat dissipation unit is integrally formed in the electromagnetic interference shielding structure will be described in sequence.

Figure 22:
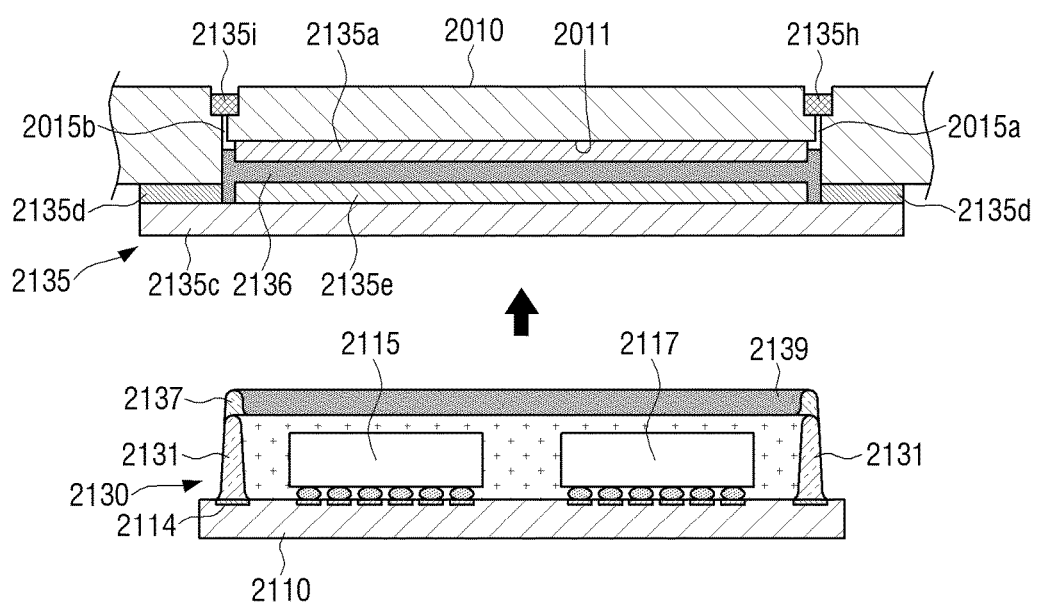
FIG. 22 is a cross-sectional view illustrating an electromagnetic interference shielding structure having a heat dissipation unit according to another embodiment of the present disclosure according to an embodiment of the present disclosure.

FIG. 22 is a cross-sectional view illustrating an electromagnetic interference shielding structure having a heat dissipation unit according to another embodiment of the present disclosure.

An electromagnetic interference shielding structure 2130 illustrated in FIG. 22 is formed by almost the same processes as the electromagnetic interference shielding structure 130a illustrated in FIG. 3. However, the electromagnetic interference shielding structure 2130 differs from the above-described electromagnetic interference shielding structure 130a in that the heat dissipation unit is not formed in the shielding layer 2139. Therefore, the configuration and manufacturing process of the electromagnetic interference shielding structure 2130 will not be described, and only the structure and manufacturing process of the heat dissipation unit 2135 will be described below (i.e., reference elements 2114, 2131 and 2137 shown in FIG. 22 respectively correspond to reference elements 114, 131 and 137 shown in FIG. 3).

Referring to FIG. 22, the heat dissipation unit 2135 may be formed on a part of the metal frame 2010. Specifically, the heat dissipation unit 2135 may be formed on one surface of the metal frame 2010 to which the electromagnetic interference shielding structure 2130 is assembled.

The heat dissipation unit 2135 may include a plurality of first channels 2135b (see FIGS. 24A to 24F) formed in a recess 2011 formed on the metal frame 2010, a metal sheet 2135c bonded to the metal frame 2010 in a state in which the recess 2011 is closed, and a plurality of second channels 2135f (see FIGS. 24A to 24F) formed on one surface of the metal sheet 2135c.

The plurality of first and second channels 2135b and 2135f are used as passages through which the liquefied volatile material 2136 moves, such as a plurality of channels 337 of the heat dissipation unit 335 illustrated in FIG. 15.

The metal sheet 2135c is preferably made of a metal having high thermal conductivity to increase an absorption rate of heat emitted from the electromagnetic interference shielding structure 2130. The metal sheet 2135c may have various shapes and preferably has a shape corresponding to the outside of the recess 2011.

The metal sheet 2135c is firmly bonded to the metal frame 2010 by heat fusion processing, laser bonding processing, ultrasonic bonding processing, high viscosity bonding processing, low temperature nano bonding processing, or the like. By the processing, the metal sheet 2135c is firmly bonded to the metal frame 2010 to withstand an internal pressure generated from the inside of the heat dissipation unit 2135 when the volatile material 2136 is alternately changed into vaporization and liquefaction by the heat (heat emitted from the IC chips 2115 and 2117) applied to the heat dissipation unit 2135.

It is also preferable that the metal frame 2010 is bonded to the metal sheet 2135c so that the gap is not formed between the metal frame 2010 and the metal sheet 2135c, thereby preventing the liquefied volatile material 2136 from being leaked between the metal frame 2010 and the metal sheet 2135c.

The metal frame 2010 may be formed with at least two through holes 2015a and 2015b. The first and second through holes 2015a and 2015b are formed to penetrate from an opposite surface to one surface of the recess 2011 with respect to one surface of the metal frame 2010 on which the recess 2011 is formed.

The first through hole 2015a is used to inject the volatile material 2136 into the heat dissipation unit 2135, the second through hole 2015b keeps the inside of the heat dissipation unit 2135 in an atmospheric state so that the volatile material 2136 may be smoothly injected into the heat dissipation unit 2135 when the volatile material 2136 is injected through the first through hole 2015a.

The first and second through holes 2015a and 2015b inject the volatile material 2136 into the heat dissipation unit 2135 and are then closed by a separate sealing member 2135h.

The manufacturing process of the heat dissipation unit 2135 will be described sequentially with reference to FIGS. 23 to 26.

Figure 23A:
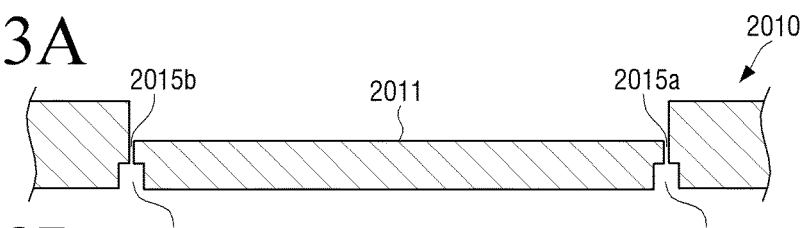
Figure 23B:
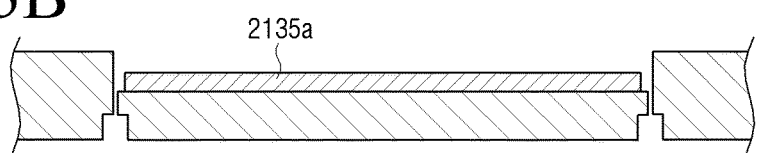

FIGS. 23A, 23B, 23C, 23D, 23E, and 23F are diagrams sequentially illustrating the manufacturing process of the heat dissipation unit illustrated in FIG. 22, FIGS. 24A to 24F are diagrams illustrating side cross sections of each process of FIGS. 23A to 23F, and FIGS. 25 and 26 each are plan views corresponding to FIGS. 23A and 23B.

Figure 24A:
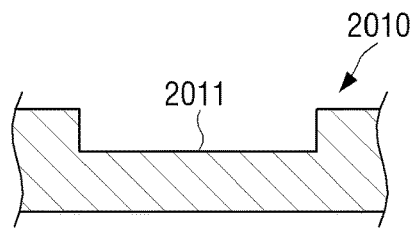
Figure 25:
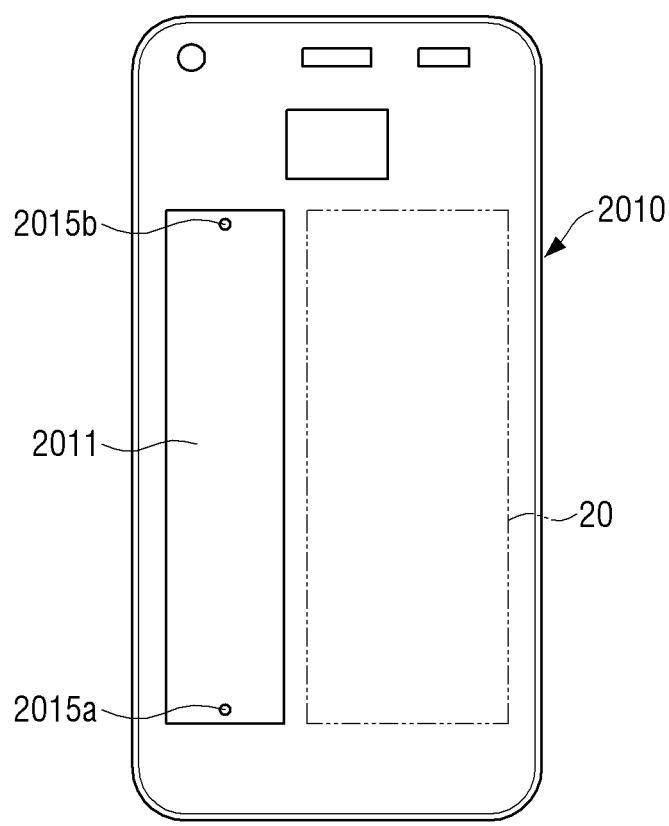
FIG. 25 is a plane view corresponding to FIG. 23A according to an embodiment of the present disclosure.

Referring to FIGS. 23A, 24A and 25, the recess 2011 on which a first fine pattern 2135a is to be formed are formed on one surface of the metal frame 2010. In this case, the first and second through holes 2015a and 2015b are penetrated in the recess 2011. The through holes 2015a and 2015b connect to spaces or voids 2013, as illustrated in FIG. 23A.

Figure 24B:
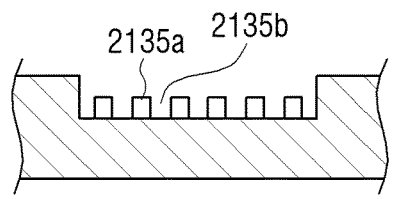
Figure 26:
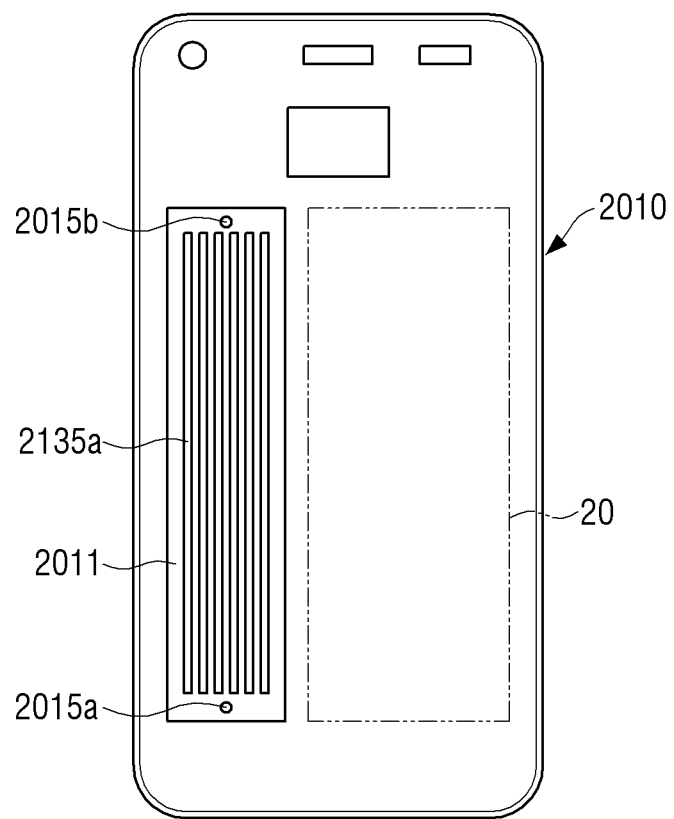
FIG. 26 is a plan view corresponding to FIG. 23B, and is a diagram illustrating an example of forming a fine pattern in a groove formed in a metal frame according to an embodiment of the present disclosure.

Referring to FIGS. 23B, 24B and 26, a polymer-based material is dispensed onto a bottom of the recess 2011 while the nozzle (not illustrated) is moved, thereby forming a first fine pattern 2135a along a longitudinal direction of the recess 2011. The first fine pattern 2135a is formed of a plurality of narrow and long protrusions arranged at regular intervals. A plurality of first channels 2135b through which the liquefied volatile material 2136 moves are formed between the plurality of projections.

Figure 23C:

Meanwhile, FIGS. 23C and 24C, the metal sheet 2135c is applied with an adhesive 2135d along one edge of one surface thereof. The adhesive 2135d serves to temporarily fix the metal sheet 2135c to the metal frame 2010 before bonding the metal sheet 2135c to the metal frame 2010. The process of applying the adhesive 2135d to the metal sheet 2135c may be performed after the second fine pattern 2135e is formed.

Figure 23D:
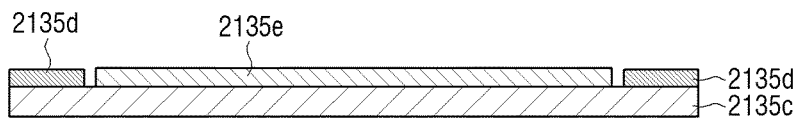
Figure 24D:
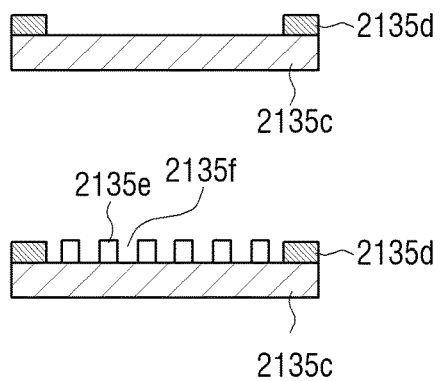

Referring to FIGS. 23D and 24D, a polymer-based material is dispensed onto one surface of the metal sheet 2135c while the nozzle (not illustrated) is moved to form a second fine pattern 2135e corresponding to the first fine pattern 2135a. Like the first fine pattern 2135a, the second fine pattern 2135e is also formed of a plurality of narrow and long protrusions arranged at regular intervals. A plurality of second channels 2135f through which the liquefied volatile material 2136 moves are formed between the plurality of protrusions.

Figure 23E:
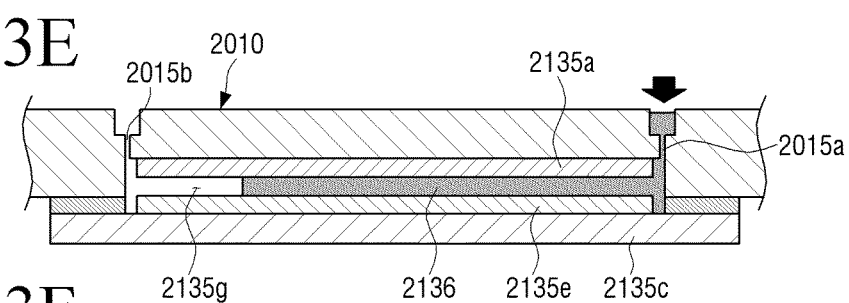
Figure 24E:
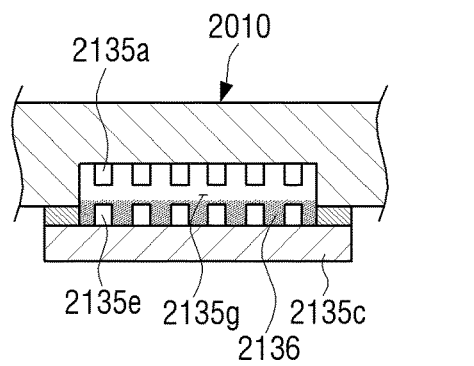

If the process of forming the first and second fine patterns 2135a and 2135e is completed as described above, the metal sheet 2135c is attached to the metal frame 2010 as illustrated in FIGS. 23E and 24E. In this case, the plurality of first and second channels 2135b and 2135f may be arranged to correspond to each other. However, the plurality of first and second channels 2135b and 2135f may be of course arranged at a position at which they do not correspond to each other. In this case, the movement of the liquefied volatile material 2136 is not affected.

The metal sheet 2135c temporarily fixed to the metal frame 2010 is firmly bonded to the metal frame 2010 by any one of heat fusion bonding processing, laser bonding processing, ultrasonic bonding processing, high viscosity bonding processing, and low-temperature nano bonding processing.

Subsequently, the liquefied volatile material is injected into a space 2135g formed inside the heat dissipation unit 2135 through the first through hole 2015a. At this time, the space 2135g in which the volatile material is stored communicates with the outside through the second through hole 2015b, and thus is in an atmospheric pressure state. Accordingly, the volatile material 2136 may be smoothly injected into the space 2135g. The injection amount of the volatile material 2136 is about 40% to 80% with respect to the volume of the space 2135g.

Figure 23F:
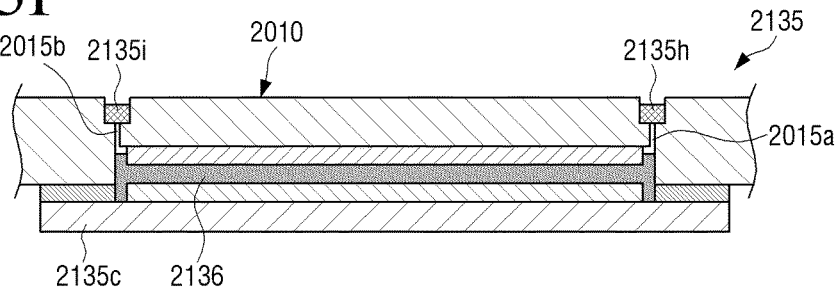
Figure 24F:
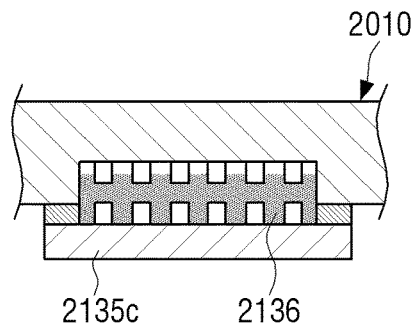

Referring to FIGS. 23F and 24F, if the injection process of the volatile material 2136 is completed, the first and second through holes 2015a and 2015b are each closed using a sealing member 2135h and 2135i.

If the heat dissipation unit 2135 is formed as described above, as illustrated in FIG. 22, the PCB 2110 on which the electromagnetic interference shielding structure 2130 is formed is assembled to the metal frame 2010. As a result, the shielding layer 2139 of the electromagnetic interference shielding structure 2130 comes into contact with the other side surface of the metal sheet 2135c while adhering to the metal sheet 2135c.

Accordingly, the heat emitted from the IC chips 2115 and 2117 shielded by the electromagnetic interference shielding structure 2130 is transferred to the heat dissipation unit 2135. The volatile material 2136 are vaporized at a part where heat is applied to the heat dissipation unit 2135 and moves away from the IC chips 2115 and 2117 along the space 2135g. The vaporized volatile material transfers heat to the metal frame while moving along the space 2135g and is gradually liquefied. The liquefied volatile material moves toward the direction in which the IC chips 2115 and 2117 are disposed along the plurality of first and second channels 2135b and 2135f by the capillary phenomenon.

In this way, the volatile material is alternately repeatedly vaporized and liquefied in the space of the heat dissipation unit 2135 while being circulated along the longitudinal direction of the heat dissipation unit 2135, thereby dissipating the heat emitted from the IC chips 2115 and 2117 to the metal frame 2010.

The heat dissipation unit 2135 described above is manufactured by the 3D printing, and therefore may have various shapes. In this case, it is preferable that the shape of the recess 2011 formed in the metal frame 2010 is formed to have a shape corresponding to the shape of the heat dissipation unit 2135.

FIG. 26 is a plan view corresponding to FIG. 23B, and is a diagram illustrating an example of forming a fine pattern in a groove formed in a metal frame according to an embodiment of the present disclosure.

Hereinafter, examples of various types of recesses and fine patterns formed in each recess will be described with reference to FIGS. 27 to 30.

FIGS. 27, 28, 29, and 30 are diagrams illustrating grooves having various shapes formed in the metal frame and fine patterns having various shapes formed corresponding to the grooves.

Figure 27:
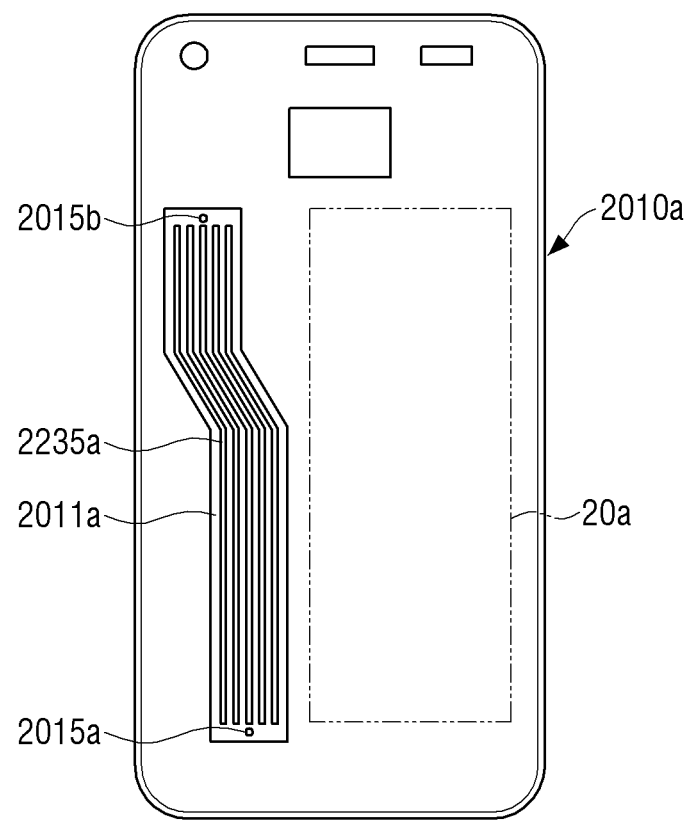
FIGS. 27, 28, 29, and 30 are diagrams illustrating grooves having various shapes formed in the metal frame and fine patterns having various shapes formed corresponding to the grooves according to an embodiment of the present disclosure.

Referring to FIG. 27, the recess 2011a is formed on one side of the metal frame 2010a and may be formed substantially along the length direction of the metal frame 2010a. In this case, a central portion of the recess 2011a may be bent at multiple stages. The fine pattern 2235a formed on the recess 2011a may be formed in a state where a part of the fine pattern 2235a is bent in multiple stages along the shape of the recess 2011a.

The recess 2011a may be formed in a shape corresponding to the shape of the heat dissipation unit. The shape of the recess 2011a may be determined in consideration of the shape of the heat dissipation unit and a position of a structure disposed on the metal frame 2010a, for example, a position of a battery 20a.

Figure 28:
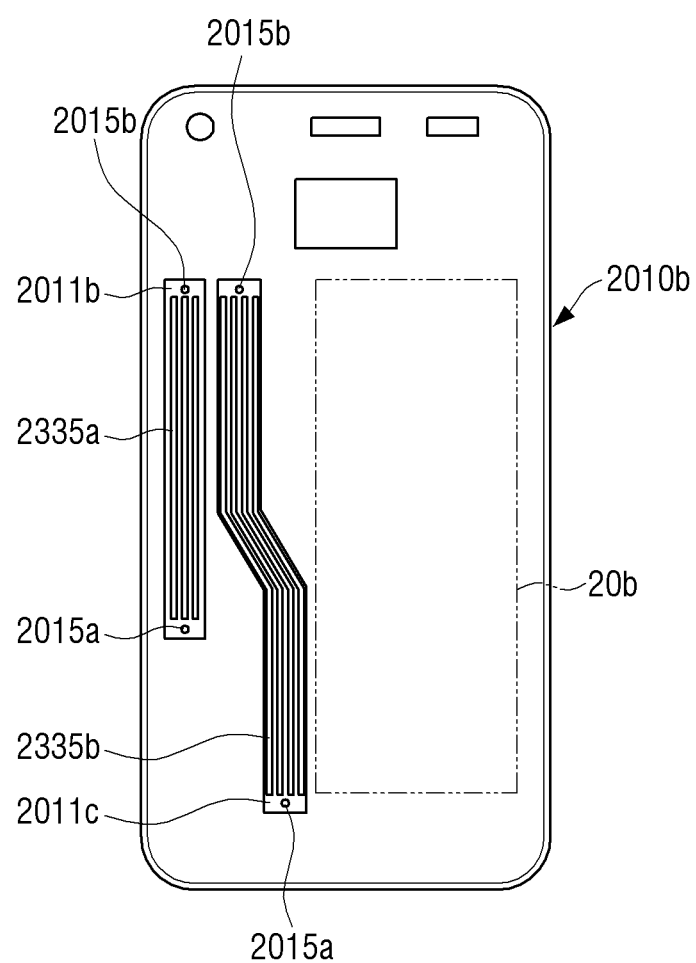

Referring to FIG. 28, when two heat dissipation units are provided, two recesses 2011b and 2011c may be formed to correspond to the respective heat dissipation units. In this case, each of the recesses 2011b and 2011c may be formed with fine patterns 2335a and 2335b according to the shape of each recess. The shape and arrangement of the plurality of recesses 2011b and 2011c may be determined in consideration of the shape of the heat dissipation unit and the position of the structure disposed on the metal frame 2010b, for example, a position of a battery 20b.

Figure 29:
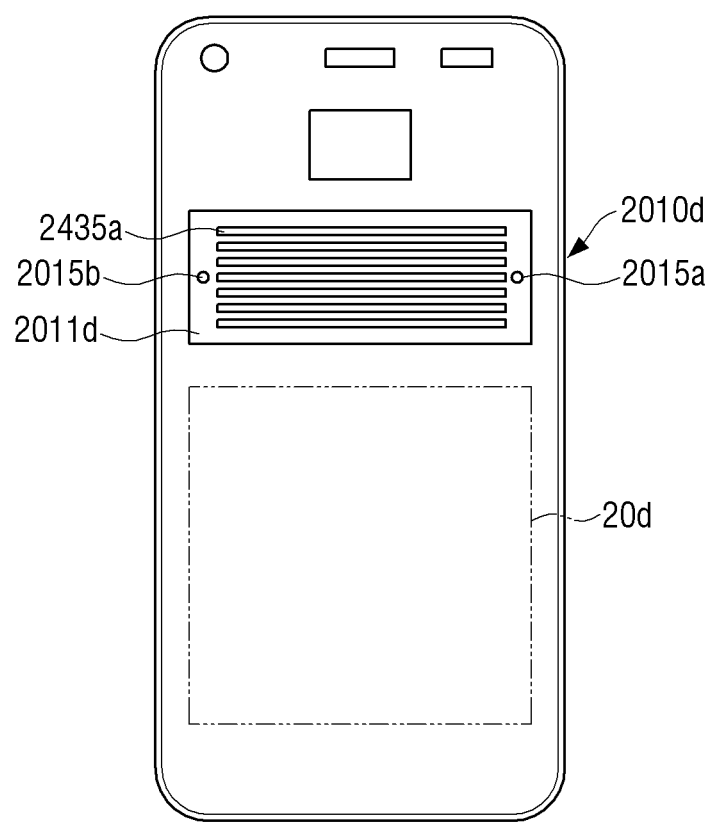

Referring to FIG. 29, the recess 2011d may be formed substantially along a width direction of the metal frame 2010d. In this case, a fine pattern 2435a may be formed along a longitudinal direction of the recess 2011d. The shape and arrangement of the recess 2011d may be determined in consideration of the shape of the heat dissipation unit and the position of the structure disposed on the metal frame 2010d, for example, a position of a battery 20d.

Figure 30:
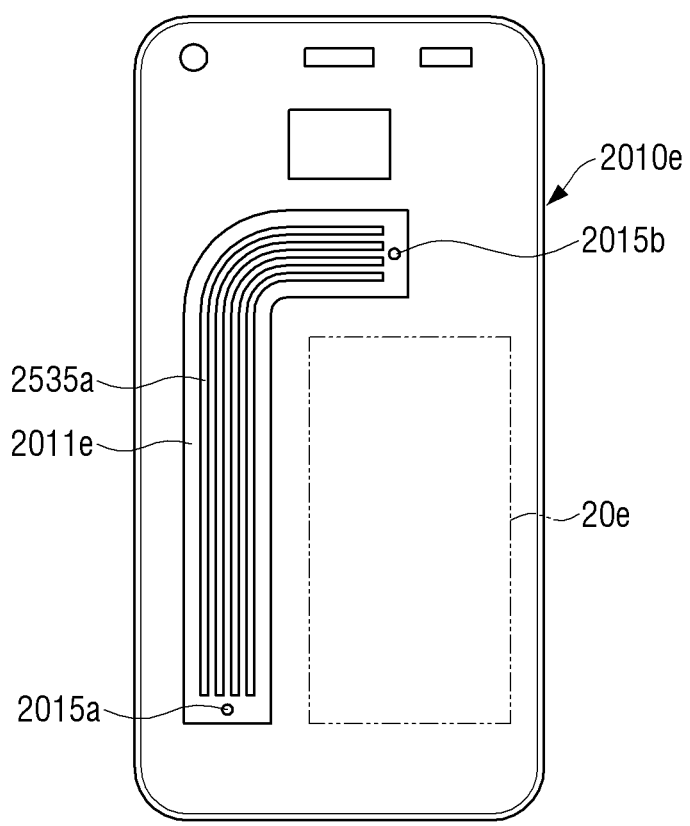

Referring to FIG. 30, a recess 2011e may be formed in a width direction and a length direction of the metal frame 2010e by being bent into a substantially '⌐' shape. In this case, a fine pattern 2535a may be bent in a '⌐' shape according to the shape of the recess 2011e. The shape and arrangement of the recess 2011e may be determined in consideration of the shape of the heat dissipation unit and the position of the structure disposed on the metal frame 2010e, for example, a position of a battery 20e.

Meanwhile, reference numerals 2015a and 2015b respectively illustrated in FIGS. 27 to 30 indicate through holes penetrating through the respective recesses.

As described above, when the 3D printing is used, a large-capacity heat dissipation unit 2135 may be manufactured at low cost. Further, the heat dissipation unit 2135 may be easily manufactured into various designs corresponding to the arrangement or shape of a single or plural electromagnetic interference shielding structures.

Figure 31:
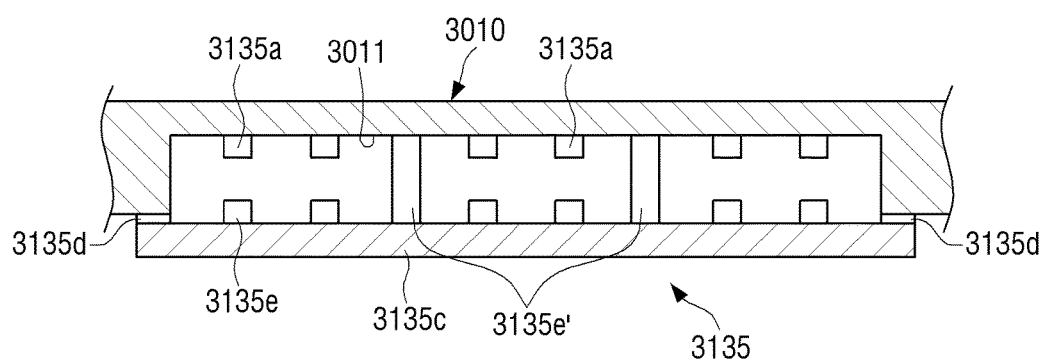
FIG. 31 is a cross-sectional view illustrating an example in which the heat dissipation unit illustrated in FIG. 24E extends in a transverse direction according to an embodiment of the present disclosure.

FIG. 31 is a cross-sectional view illustrating an example in which the heat dissipation unit illustrated in FIG. 24E extends in a transverse direction according to an embodiment of the present disclosure.

Figure 32:
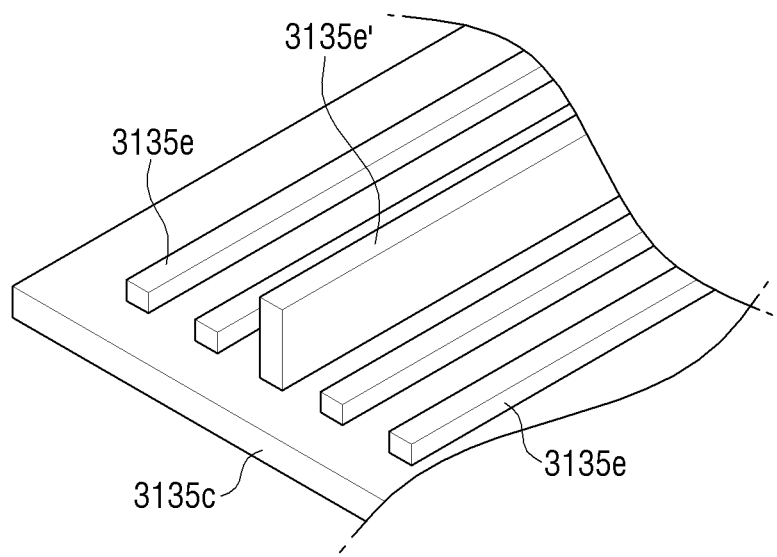
FIG. 32 is a perspective view illustrating the fine pattern formed in the heat dissipation unit illustrated in FIG. 31 according to an embodiment of the present disclosure.

FIG. 32 is a perspective view illustrating the fine pattern formed in the heat dissipation unit illustrated in FIG. 31 according to an embodiment of the present disclosure.

Referring to FIG. 31, a size of a heat dissipation unit 3135 may extend in a horizontal direction compared to the heat dissipation unit illustrated in FIG. 24E. In this case, the inner space of the heat dissipation unit 3135 is also wide, and therefore a structure supporting a metal sheet 3135 may be required.

Referring to FIG. 32, a height of one 3135e' of second fine patterns 3135e and 3135e' formed on the metal sheet 3135c may be formed to be higher than that of the other 3135e of the second fine patterns 3135e and 3135e'. Accordingly, when the metal sheet 3135c is bonded to the metal frame 3010, one 3135e 'of the second fine patterns 3135e and 3135e' comes into contact with the recess 3011 of the metal frame 3010, thereby supporting the metal sheet 3135c. The metal sheet 3135c may be bonded to the metal frame 3010 by adhesive 3135d, as shown in FIG. 31.

Meanwhile, it is of course possible to support the metal sheet 3135c by forming the height of a part of the first fine pattern 3135a to be higher than the height of the remaining part the first fine pattern 3135a, instead of the second fine pattern 3135e.

Figure 33:
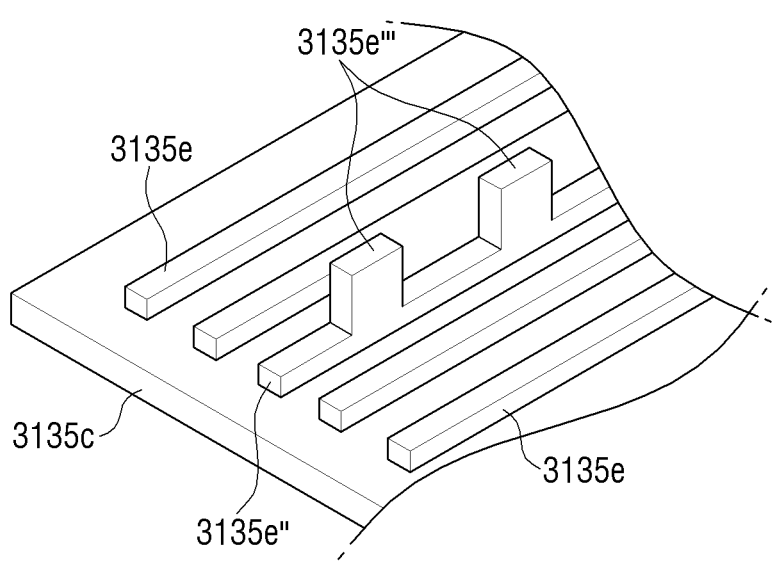
FIG. 33 is a perspective view illustrating another example of the fine pattern illustrated in FIG. 32 according to an embodiment of the present disclosure.

FIG. 33 is a perspective view illustrating another example of the fine pattern illustrated in FIG. 32 according to an embodiment of the present disclosure.

Referring to FIG. 33, one 3135e" of the second fine patterns 3135e and 3135e" formed on the metal sheet 3135e may be formed with a support protrusion 3135e''' protruding at a predetermined height to contact the recess of the metal frame when the metal sheet 3135c is bonded to the metal frame. In this case, it is of course possible that the support protrusion 3135e''' 'is formed in a part of the first fine pattern instead of the second fine pattern.

When a part of fine pattern is formed to be larger in height than that of the remaining part, a separate structure for supporting the metal sheet to the recess of the metal frame may be omitted.

Hereinafter, an example in which the heat dissipation unit is integrally formed in the electromagnetic interference shielding structure by the 3D printing will be described.

Figure 34:
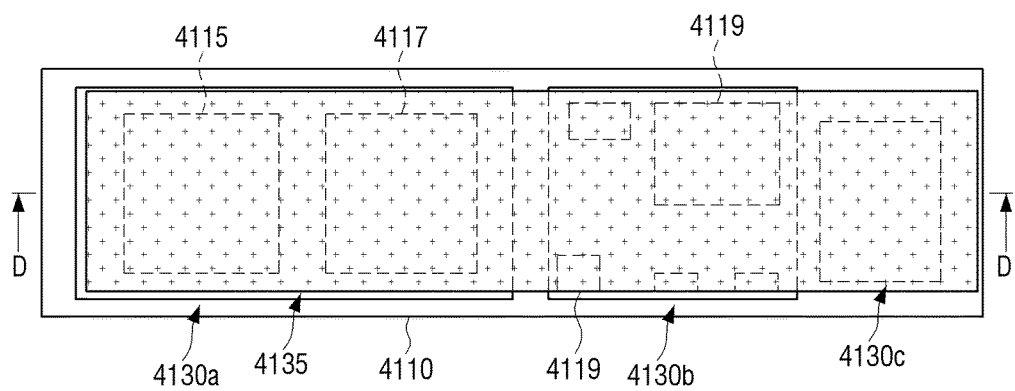
FIG. 34 is a cross-sectional view illustrating an electromagnetic interference shielding structure having a heat dissipation unit according to an embodiment of the present disclosure.
Figure 35:
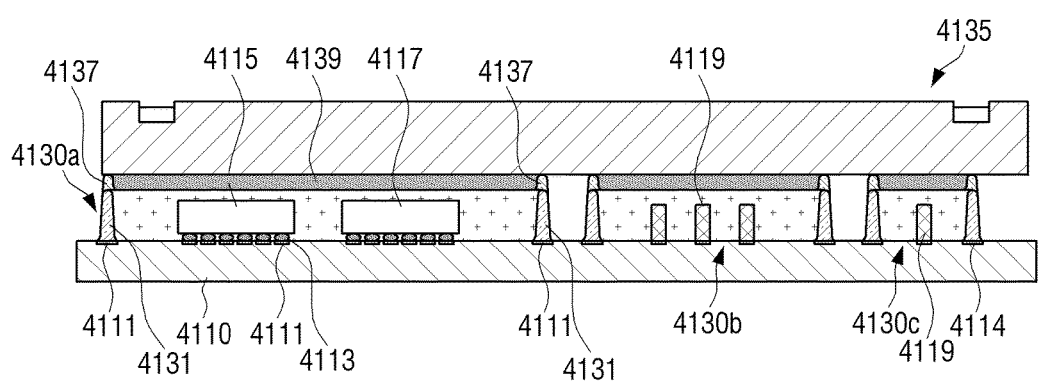
FIG. 35 is a cross-sectional view taken along the line D-D illustrated in FIG. 34 according to an embodiment of the present disclosure.

FIG. 34 is a plan view illustrating an electromagnetic interference shielding structure having a heat dissipation unit according to another embodiment of the present disclosure and FIG. 35 is a cross-sectional view taken along the line D-D illustrated in FIG. 34 according to an embodiment of the present disclosure.

Referring to FIGS. 34 and 35, a plurality of electromagnetic interference shielding structures 4130a, 4130b, and 4130c may be formed on a PCB 4110. The single heat dissipation unit 4135 (e.g., single heat dissipator) is integrally formed on upper parts of the plurality of electromagnetic interference shielding structures 4130a, 4130b, and 4130c, and may absorb heat emitted from IC chips 4115 and 4117 and transfer the heat to the metal frame.

FIGS. 36A, 36B, 36C, 36D, 36E, 36F, and 36G are diagrams sequentially illustrating the manufacturing process of the heat dissipation unit illustrated in FIG. 35, and FIGS. 37A, 37B, 37C, 37D, 37E, 37F, and 37G are side cross-sectional views for each process according to an embodiment of the present disclosure.

Figure 36A:
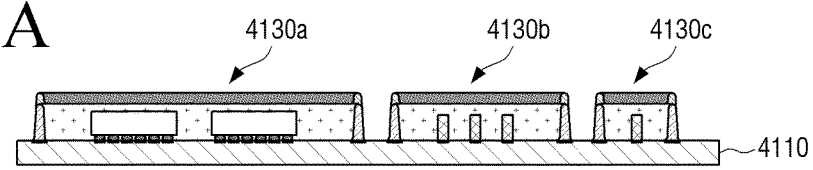
FIGS. 36A, 36B, 36C, 36D, 36E, 36F, 36G, 37A, 37B, 37C, 37D, 37E, 37F, and 37G are diagrams sequentially illustrating a manufacturing process of the heat dissipation unit illustrated in FIG. 35 according to an embodiment of the present disclosure.
Figure 37A:
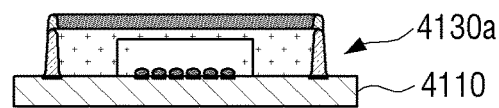

Referring to FIGS. 36A and 37A, first to third electromagnetic interference shielding structures 4130a, 4130b and 4130c are formed on a PCB 4110 by shielding a plurality of circuit elements. The first to third electromagnetic interference shielding structures 4130a, 4130b, and 4130c are manufactured by the same process as the electromagnetic interference shielding structure 130a described above, and therefore the detailed manufacturing processes/elements thereof will be omitted (e.g., reference elements 4111, 4114, 4131, 4137 and 4139 shown in FIG. 35 may similar to corresponding elements shown in FIG. 3, and reference element 4119 shown in FIG. 35 may correspond to an IC chip 115 shown in FIG. 3 or another structure that positioned on the PCB 4110).

Figure 36B:
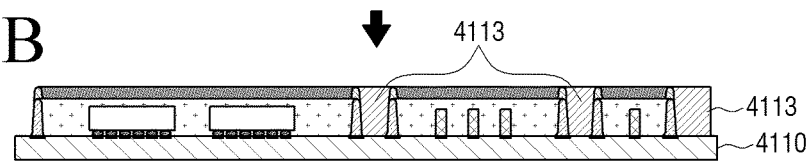
Figure 37B:
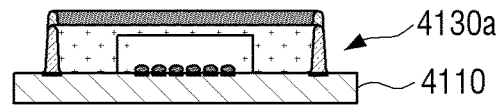

Referring to FIGS. 36B and 37B, a support member 4113 is formed between the first and second electromagnetic interference shielding structures 4130a and 4130b, between the second and third electromagnetic interference shielding structures 4130b and 4130c, and in a space on one side of the third electromagnetic interference structure 4130c, respectively. The support member 4113 supports the heat dissipation unit 4135 formed on upper parts of the first to third electromagnetic interference shielding structures 4130a, 4130b and 4130c and is removed after the heat dissipation unit 4135 is formed. Therefore, the support member 4113 may be made of a material (e.g., paraffin) which is kept in a solid state at room temperature and changes into a liquid when heated at a predetermined temperature.

The support member 4113 may be formed to have the same height as the height of the first to third electromagnetic interference shielding structures 4130a, 4130b, and 4130c.

Figure 36C:
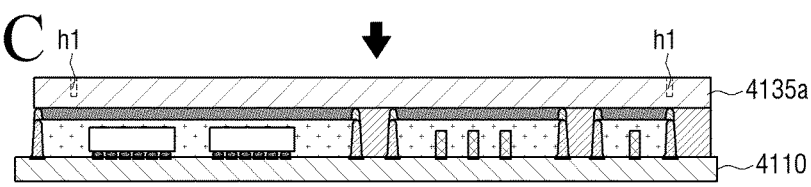
Figure 37C:
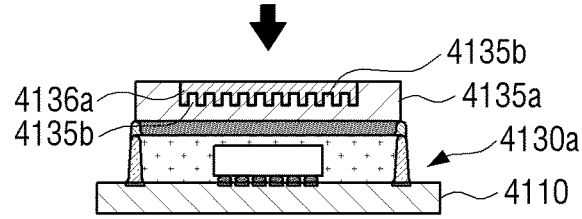

Referring to FIGS. 36C and 37C, a lower part 4135a of the heat dissipation unit 4135 is formed on the upper surfaces of the first to third electromagnetic interference shielding structures 4130a, 4130b and 4130c and the support member 4113 by the 3D printing. In this case, it is preferable that the material forming the lower part 4135a of the heat dissipation unit 4135 is a material that includes a metal filler having a heat transfer rate to have high thermal conductivity and has high viscosity so that the shape after the formation keeps unchanged.

An upper surface of the lower part 4135a of the heat dissipation unit 4135 is formed with a recess. The recess is formed with a first fine pattern 4135b so that a plurality of first channels may be formed. In addition, the lower part 4135a of the heat dissipation unit 4135 is provided with a plurality of through holes h1 for injecting a volatile material 4136b.

When the lower part 4135a of the heat dissipation unit 4135 including the first fine pattern 4135b is formed, a support member 4136a for supporting the upper part 4135c of the heat dissipation unit 4135 is injected. The support member 4136a is preferably made of the same material as the support member 4113 described above to be easily removed after the upper part 4135c of the heat dissipation unit 4135 is formed.

Figure 36D:
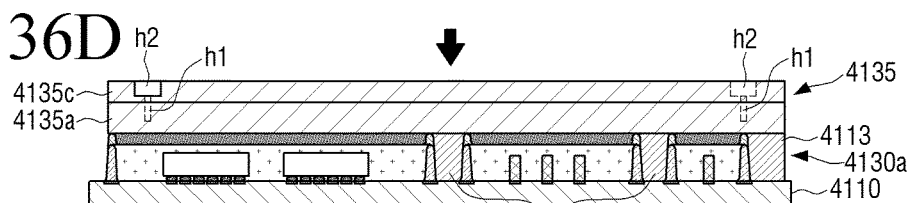
Figure 37D:
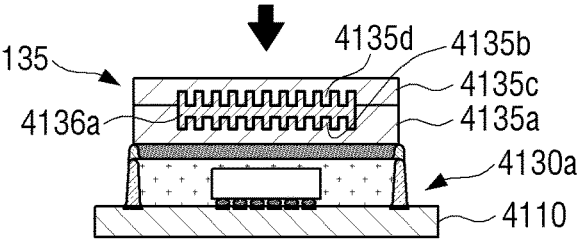

Referring to FIGS. 36D and 37D, the upper part 4135c of the heat dissipation unit 4135 is formed on the upper surface of the lower part 4135a of the heat dissipation unit 4135 by the 3D printing. In this case, the material forming the upper part 4135c of the heat dissipation unit 4135 uses the same material as the material forming the lower part 4135a of the heat dissipation unit 4135. The upper part 4135c of the heat dissipation unit 4135 is formed with a second fine pattern 4135d so that a plurality of second channels may be formed on the bottom surface. In addition, the upper part 4135c of the heat dissipation unit 4135 is provided with a plurality of through holes h2 for injecting a volatile material 4136b. The plurality of through holes h2 of the upper part 4135c are each set at positions capable of communicating with the plurality of through holes h1 of the lower part 4135a.

Figure 36E:
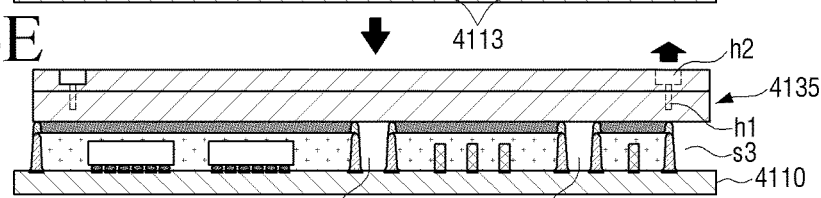
Figure 37E:
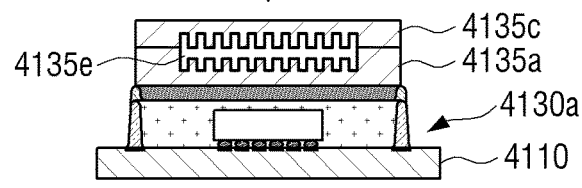

Referring to FIGS. 36E and 37E, the support member 4136a disposed inside the heat dissipation unit 4135 is removed. If the support member 4136a is made of paraffin, a predetermined heat is applied to the heat dissipation unit 4135 to change the solid-state support member 4136a into a liquid state, and then dispense the support member 4136a to the outside of the heat dissipation unit 4135 through the plurality of holes h1 and h2. In this case, in the process of removing the support member 4136a inside the heat dissipation unit 4135, the support member 4113 supporting the heat dissipation unit 4135 on the lower side of the heat dissipation unit 4135 may be removed together with the support member 4136a inside the heat dissipation unit 4135 while being changed to a liquid by the heat applied to the heat dissipation unit 4135.

Figure 36F:
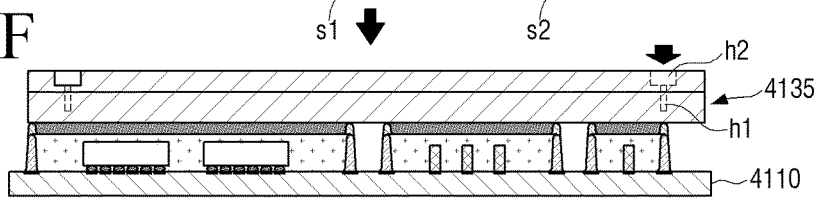
Figure 37F:
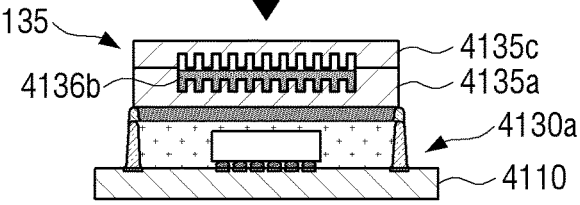

Referring to FIGS. 36F and 37F, the volatile material 4136b is injected into the inner space of the heat dissipation unit 4135 from which the support member 4136a is removed through the plurality of holes h1 and h2. The injection amount of the volatile material 4136b is about 40 to 80% with respect to the volume of the inner space of the heat dissipation unit 4135.

Figure 36G:
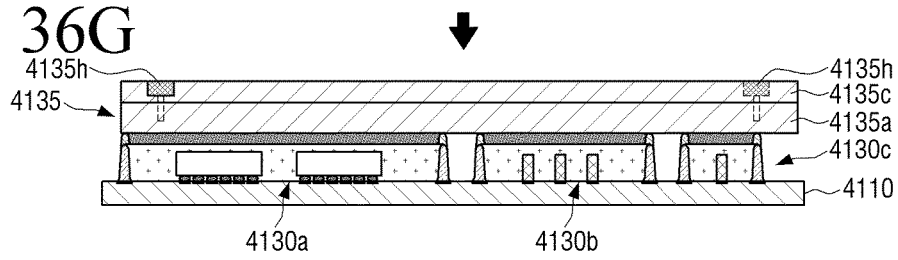
Figure 37G:
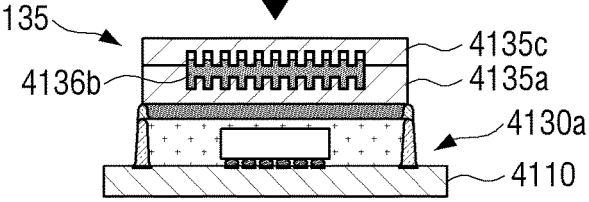

Referring to FIGS. 36G and 37G, after the process of injecting the volatile material 4136b into the inner space of the heat dissipation unit 4135 is completed, the plurality of holes h2 formed on the upper part 4135c of the heat dissipation unit 4135 are closed by the sealing member 4135h to prevent the volatile material 4136b from being leaked to the outside of the heat dissipation unit 4135.

In this way, after the heat dissipation unit 4135 is integrally formed on the plurality of electromagnetic interference shielding structures 4130a, 4130b, and 4130c, the PCB 4110 is assembled to the metal frame. In this case, the heat dissipation unit 4135 may have elasticity depending on the material forming the heat dissipation unit. When the heat-dissipation unit 4135 has elasticity, the upper surface of the heat-dissipation unit 4135 may be in contact with the metal frame while adhering to one surface of the metal frame. Accordingly, the contact area of the upper surface of the heat dissipation unit 4135 with one surface of the metal frame may be maximized, so the heat transfer efficiency may be maximized.

The embodiment illustrated in FIGS. 35 to 37 describes that the plurality of electromagnetic interference shielding structures 4130*a*, 4130*b*, and 4130*c* are formed, but the present disclosure is not limited thereto. Therefore, the heat dissipation unit can be integrally on the single electromagnetic interference shielding structure by the 3D printing. When the heat dissipation unit is formed in the single electromagnetic interference shielding structure, the process of forming the support member 4113 for temporarily supporting the heat dissipation unit may be omitted.

In addition, if the heat dissipation unit 4135 is made of the electroconductive material like the shielding layer and the upper end of the shielding dam and the insulating member are completely covered to perform a shielding function together with the shielding dam, it is also possible to omit the process of forming the shielding layer.

While the present disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electromagnetic interference shielding structure, comprising:
    an insulating member covering at least one circuit element mounted on a printed circuit board (PCB);
    a shielding member covering the insulating member; and
    a heat dissipator having a surface adhered to the shielding member and configured to transfer heat emitted from the at least one circuit element to a place where temperature is relatively low,
    wherein an upper surface of the shielding member is formed with an insertion groove into which a part of the heat dissipator is inserted.

2. The electromagnetic interference shielding structure as claimed in claim 1, wherein at least a part of the heat dissipator is embedded in the shielding member.

3. The electromagnetic interference shielding structure as claimed in claim 1, wherein the heat dissipator is inserted into a groove formed on a heat dissipation target disposed opposite to the upper surface of the shielding member.

4. The electromagnetic interference shielding structure as claimed in claim 1,
    wherein an inner space of the heat dissipator is stored with a liquefied volatile material, and
    wherein the inner space is formed with a passage through which a gaseous volatile material moves.

5. The electromagnetic interference shielding structure as claimed in claim 4, wherein the passage is formed of any one of a porous member, a plurality of channels formed by a plurality of fine patterns, and a net member.

6. The electromagnetic interference shielding structure as claimed in claim 1,
    wherein the shielding member includes a shielding dam surrounding a side surface of the insulating member, an edge bridge formed on an upper part of the shielding dam, and a shielding layer covering the upper surface of the insulating member and contacting the edge bridge, and
    wherein the heat dissipator is embedded in the shielding layer.

7. The electromagnetic interference shielding structure as claimed in claim 1, wherein the heat dissipator is provided in plural.

8. The electromagnetic interference shielding structure as claimed in claim 1, wherein the heat dissipator is formed on a heat dissipation target corresponding to the upper surface of the shielding member.

9. The electromagnetic interference shielding structure as claimed in claim 8, wherein the heat dissipator includes:
    a first fine pattern formed on a recess of one surface of the heat dissipation target;
    a metal sheet bonded to the heat dissipation target;
    a second fine pattern formed on one surface of the metal sheet to face the first fine pattern; and
    a liquefied volatile material stored in an inner space of the heat dissipator.

10. The electromagnetic interference shielding structure as claimed in claim 9, wherein the first and second fine patterns are formed by three-dimensional (3D) printing.

11. The electromagnetic interference shielding structure as claimed in claim 9, wherein a part of the first fine pattern or a part of the second fine pattern is formed to have a height larger than that of the first and second fine patterns.

12. The electromagnetic interference shielding structure as claimed in claim 9,
    wherein the heat dissipation target is formed with a plurality of holes for injecting a volatile material into an inner space of the heat dissipation target, and
    wherein the plurality of holes is closed by a sealing member.

13. An electromagnetic interference shielding structure, comprising:
    an insulating member covering at least one circuit element mounted on a printed circuit board (PCB);
    a shielding member covering the insulating member; and
    a heat dissipator integrally formed on an upper part of the shielding member and configured to transfer heat emitted from the at least one circuit element to a place where temperature is relatively low,
    wherein an inner space of the heat dissipator is
        stored with a liquefied volatile material, and
        formed with a plurality of channels through which the volatile material moves along an inner side surface thereof.

14. A method for manufacturing an electromagnetic interference shielding structure, the method comprising:
    forming a shielding dam to surround at least one circuit element mounted on a printed circuit board (PCB);
    forming an insulating member covering the at least one circuit element in a space formed by the shielding dam;
    disposing a heat dissipator on an upper surface of the insulating member;
    after the disposing of the heat dissipator, forming an edge bridge along an upper end of the shielding dam; and
    forming a shielding layer covering the insulating member and the heat dissipator in the space formed by the edge bridge.

15. The method as claimed in claim 14, further comprising:
    after the disposing of the heat dissipator, forming a shielding layer covering an upper end of the shielding dam and the heat dissipator.

16. A method for manufacturing an electromagnetic interference shielding structure, the method comprising:
    forming a shielding dam to surround at least one circuit element mounted on a printed circuit board (PCB);

forming an insulating member covering the at least one circuit element in a space formed by the shielding dam;

forming a shielding layer covering an upper end of the shielding dam and the insulating member; and disposing a heat dissipator on an upper surface of the shielding layer, wherein in the forming of the shielding layer, a recess into which a part of the heat dissipator is inserted is formed.

* * * * *